United States Patent
Kasuga et al.

(10) Patent No.: US 7,127,810 B2
(45) Date of Patent: Oct. 31, 2006

(54) METHOD OF MANUFACTURING ELECTRONIC DEVICE INCLUDING ALIGNING FIRST SUBSTRATE, SECOND SUBSTRATE AND MASK, AND TRANSFERRING OBJECT FROM FIRST SUBSTRATE TO SECOND SUBSTRATE, INCLUDING IRRADIATING OBJECT ON FIRST SUBSTRATE WITH LIGHT THROUGH MASK

(75) Inventors: Masashi Kasuga, Suwa (JP);
Tomoyuki Kamakura, Matsumoto (JP);
Wakao Miyazawa, Chino (JP);
Fukumi Tsuchihashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 418 days.

(21) Appl. No.: 10/420,882

(22) Filed: Apr. 23, 2003

(65) Prior Publication Data
US 2004/0000368 A1   Jan. 1, 2004

(30) Foreign Application Priority Data
Apr. 25, 2002   (JP)   ............................ 2002-124866

(51) Int. Cl.
*H05K 3/30* (2006.01)
(52) U.S. Cl. ............................ 29/833; 29/832; 29/830; 29/840; 29/739; 29/740; 29/712; 430/5; 430/126; 430/311; 356/399; 356/400; 356/401; 250/548

(58) Field of Classification Search ................. 29/832, 29/830, 833, 840, 739, 740, 712; 430/5, 430/126, 311; 356/401, 399, 400; 250/548
See application file for complete search history.

(56) References Cited

U.S. PATENT DOCUMENTS 3,264,105 A * 8/1966 Houtz, Jr. .................... 430/312
5,170,058 A * 12/1992 Berasi et al. ................ 250/548

FOREIGN PATENT DOCUMENTS

| JP | A-11-142878 | 5/1999 |
|---|---|---|
| WO | WO 02/06902 A2 | 1/2002 |
| WO | WO 02/08835 A2 | 1/2002 |

* cited by examiner

*Primary Examiner*—Richard Chang
(74) *Attorney, Agent, or Firm*—Oliff & Berridge, PLC

(57) ABSTRACT

A method of manufacturing an electronic device includes providing a mask substrate, a first substrate on which an object to be transferred is formed, and a second substrate to which the object is to be transferred, adjusting positions of the mask substrate, the first substrate and the second substrate so that an alignment mark formed on one of the substrates (a reference substrate) and alignment marks formed on other two of the substrates are aligned with each other, and transferring the object to be transferred from the first substrate to the second substrate, the transferring step including irradiating the object to be transferred from the first substrate with light transmitted through the mask substrate.

18 Claims, 22 Drawing Sheets

(a)

(b)

MASK SET

ORIGINAL SUBSTRATE
PARTIAL APPLICATION OF ADHESIVE AGENT

ORIGINAL SUBSTRATE/DESTINATION SUBSTRATE
ADJUSTMENT OF ALIGNMENT

ORIGINAL SUBSTRATE/DESTINATION SUBSTRATE
ADHESION/LASER IRRADIATION

PEEL AND TRANSFER

ORIGINAL SUBSTRATE
PARTIAL APPLICATION OF ADHESIVE AGENT

MASK/DESTINATION SUBSTRATE
ADJUSTMENT OF ALIGNMENT

ORIGINAL SUBSTRATE/DESTINATION SUBSTRATE
ADJUSTMENT OF ALIGNMENT

DETECTION AND ADJUSTMENT OF DISTORTION AND INCLINATION

ORIGINAL SUBSTRATE/DESTINATION SUBSTRATE
ADHESION/LASER IRRADIATION (a)

(b)

(a)

(b)

(a)

(b)

METHOD OF MANUFACTURING ELECTRONIC DEVICE INCLUDING ALIGNING FIRST SUBSTRATE, SECOND SUBSTRATE AND MASK, AND TRANSFERRING OBJECT FROM FIRST SUBSTRATE TO SECOND SUBSTRATE, INCLUDING IRRADIATING OBJECT ON FIRST SUBSTRATE WITH LIGHT THROUGH MASK

BACKGROUND OF THE INVENTION

1. Field of Invention

The present invention relates to a manufacturing apparatus and a manufacturing method of manufacturing electronic devices using inter-substrate transferring technology to transfer an electronic device from one substrate to another substrate.

2. Description of Related Art

The related art includes technology of transferring an electronic device from an original substrate to another substrate. For example, a TFT-LCD (Liquid Crystal Display) manufactured on a quartz substrate in a low temperature polysilicon TFT (Thin Film Transistor) process is transferred onto a plastic substrate so as to facilitate assembling of the LCD on the plastic substrate in the form of a film, which is low in capacity for resisting heat. For example, Japanese Unexamined Patent Application Publication No. 11-142878 discloses a method of forming a display panel with transistor array, in which the TFT element is selectively transferred.

In such a technology of transferring a thin film electronic device, transfer can be performed not only in circuits (apparatus), but also in active electronic elements in a theoretical sense.

SUMMARY OF THE INVENTION

However, in order to make inter-substrate transfer of the thin film circuit or the thin film element fit for practical use, a manufacturing apparatus that can perform inter-substrate transfer automatically is required.

In addition, in inter-substrate transfer, when the substrate is formed of a flexible material, such as an organic film substrate, or when an original substrate and a destination substrate are formed of different materials, it is difficult to ensure the degree of positioning accuracy when adhering them together. In other words, the organic film substrate is liable to undulate or warp, and thus it is difficult to perform inter-substrate alignment with a high degree of accuracy.

When manufacturing a large-size liquid crystal display, which involves formation of active electronic elements or circuits on a large glass substrate, it is necessary to upsize equipment used in the manufacturing process in order to deal with large substrates. This may cause increase in cost of equipment.

Accordingly, the present invention provides a manufacturing apparatus that can perform inter-substrate transfer of a circuit or a thin film active electronic element automatically.

The present invention also provides a manufacturing apparatus that can perform an inter-thin film substrate transfer of the thin film circuit or the thin film element with a high degree of accuracy.

The present invention also provides a manufacturing apparatus that enables manufacturing a large sized electric optical device, such as a liquid crystal display or an organic EL display, using related art manufacturing equipment.

In order to address or achieve the above, an apparatus for manufacturing electronic devices according to the present invention includes: a laser device to generate laser beams, a masking unit having a masking substrate to shape beam spots of the laser beams, a first stage to place a first substrate, which carries a object to be transferred, a second stage to place a second substrate, to which the object to be transferred is transferred, an adhesive agent applying unit to apply an adhesive agent on the object to be transferred or on a transferred position on the second substrate, and a control unit to control the actions of at least the first and the second stages. The control unit transfers the object to be transferred from the first substrate to the second substrate by moving at least one of the first and the second stages to perform inter-substrate alignment of the masking substrate, the first and the second substrates, adhering the first and the second substrates, irradiating the laser beam onto the object to be transferred, and moving the first and the second substrates away from each other.

In this arrangement, an apparatus that performs inter-substrate transfer of the thin film elements or the thin film circuits automatically can be provided.

Furthermore, continuity of the manufacturing process or assembling process is ensured by providing a substrate transporting unit to transport each substrate to the stage. It is also possible to provide the stage itself with a function of transporting the substrates.

Preferably, inter-substrate alignment is performed by forming alignment marks on each of the masking substrate, and the first and the second substrates in advance, detecting the state of alignment of the alignment marks by a detecting unit, and moving at least one of the first and the second stages based on the result thereof. Accordingly, alignment between the object to be transferred on the first substrate and the position to be transferred on the second substrate can be achieved.

Preferably, the detecting unit is a CCD camera, and the state of alignment can be detected by observing the overlapping state of the alignment marks.

Preferably, the inter-substrate alignment is performed by aligning the alignment mark on the second substrate to the alignment mark on the masking substrate, and aligning the alignment mark on the first substrate to the alignment mark on the second substrate.

Preferably, the inter-substrate alignment is performed by aligning the alignment mark on the first substrate to the alignment mark on the masking substrate, and the alignment mark on the second substrate to the alignment mark on the first substrate.

Preferably, the inter-substrate alignment is performed by aligning the alignment mark on the first substrate to the alignment mark on the masking substrate and aligning the alignment mark on the second substrate to the alignment mark on the masking substrate.

Preferably, an alignment mark is formed on the first substrate for each object to be transferred. Accordingly, each of the object to be transferred can be adhered to a predetermined regions on the second substrate independently.

Preferably, the alignment mark is formed on the second substrate for each predetermined region. Accordingly, the objects to be transferred can be transferred to a plurality of positions by moving the second substrate step-by-step, thereby increasing productivity.

Preferably, the masking substrate includes a transmission window substrate formed with a transmission window smaller than the laser beam size, and a plurality of transmission window substrates each having a transmission window which is different in size from others, so that one of the transmission window substrates can be selected as needed corresponding to the shape of the object to be transferred. Accordingly, a plurality of kinds of objects to be transferred, which are different in size, can be transferred.

Preferably, the masking substrate includes a diffraction grating substrate to split the laser beam into a plurality of branches. Accordingly, a plurality of objects to be transferred can be transferred by irradiating a plurality of regions simultaneously.

Preferably, the masking substrate includes the diffraction grating substrate for splitting the laser beam into a plurality of beams, and a transmission window substrate formed with a plurality of transmission windows corresponding to the branched plurality of beams. Accordingly, a plurality of objects to be transferred being different in size can be transferred simultaneously.

Preferably, a laser beam is split into a plurality of beams by an optical fiber, or a plurality of laser beams guided from a plurality of laser beam sources through a plurality of optical fibers and the transmission window formed with a plurality of transmission windows are used. Accordingly, a plurality of objects to be transferred can be selectively transferred.

Preferably, an undulation preventing unit is provided on the second stage to reduce undulation or inclination of the second substrate. Accordingly, the second substrate can be maintained evenly, and thus a film substrate, which is liable to be warped, can easily be used.

Preferably, the undulation preventing unit includes a plurality of pressure sensors to detect the pressure arranged on the surface of the second stage on which the substrate is placed, a plurality of minutely elastic objects disposed on the surface of the second state on which the substrate is placed, and an undulation correcting unit to control expansion and contraction of the plurality of minutely elastic objects based on the respective outputs from the plurality of sensors. Accordingly, warping or undulation of the substrate can automatically be reduced or prevented.

Preferably, the pressure sensor and the minutely elastic object are constructed of a piezoelectric element.

Preferably, a piece of piezoelectric element is used as both the pressure sensor and the minutely elastic object. Accordingly, downsizing can easily be realized.

Preferably, the object to be transferred includes a thin film element or a thin film circuit. Accordingly, transfer in single thin film elements or transfer in single film circuits are achieved, whereby manufacture of the electronic device is facilitated. In particular, manufacture of large sized electric optical devices (Liquid Crystal Displays, organic EL displays, and so on) is facilitated.

Preferably, the first substrate is a transparent substrate, such as glass.

Preferably, the second substrate is a substrate on which a wiring is formed.

Preferably, the temperature of the substrate is controlled to a predetermined value by a heater or a temperature sensor disposed on the stage.

Preferably, the electronic device includes a semi-conductor device, an electric optical device, or an IC card.

A method of manufacturing electronic devices according to the present invention uses a transfer technology in which an object to be transferred formed on a first substrate is transferred onto a second substrate. The method includes: selecting one of a mask substrate having a transmission window; first and the second substrates as a reference substrate for alignment; adjusting the positions of the respective substrates so that an alignment mark formed on the reference substrate and alignment marks formed on other two substrates are aligned with each other; adhering the first and the second substrates via an adhesive agent applied on the portion of the object to be transferred; irradiating a laser onto the object to be transferred via the masking substrate and peeling the object to be transferred from the first substrate; and separating the first and the second substrates and transferring the object to be transferred to the second substrate.

In this arrangement, the object to be transferred disposed at a predetermined position on the first substrate can be transferred accurately to a selected position to be transferred on the second substrate.

A method of manufacturing electronic devices according to the present invention uses a transfer technology in which an object to be transferred formed on a first substrate is transferred to a second substrate. The method includes: aligning an alignment mark formed on the second substrate with an alignment mark formed on a masking substrate having a transmission window corresponding to the shape of the object to be transferred; aligning the alignment mark formed on the first substrate to the alignment mark formed on the second substrate; adhering the first and the second substrates via an adhesive agent applied on the portion of the object to be transferred; irradiating a laser onto the object to be transferred through the masking substrate and peeling the object to be transferred from the first substrate; and separating the first and the second substrates and transferring the object to be transferred to the second substrate.

In this arrangement, transfer of a plurality of objects to be transferred on the first substrate onto predetermined regions on the second substrate can be performed within a relatively short time by aligning the alignment mark on the first substrate with the alignment mark on the second substrate in sequence.

A method of manufacturing an electronic device according to the present invention uses a transfer technology in which an object to be transferred formed on a first substrate is transferred to a second substrate. The method includes: aligning an alignment mark formed on the first substrate with an alignment mark formed on a masking substrate having a transmission window corresponding to the shape of the object to be transferred; aligning an alignment mark formed on the second substrate with the alignment mark on the first alignment mark; adhering the first and the second substrates via an adhesive agent applied on the portion of the object to be transferred; irradiating a laser onto the object to be transferred through the masking substrate and peeling the object to be transferred from the first substrate; and separating the first and the second substrates and transferring the object to be transferred to the second substrate.

In this arrangement, the object to be transferred on the first substrate can be transferred to the position to be transferred on the second substrate.

A method of manufacturing electronic devices according to the present invention uses a peel and transfer technology in which an object to be transferred formed on a first substrate is peeled and transferred to a second substrate. The method includes: aligning an alignment mark formed on the first substrate with an alignment mark formed on the masking substrate having transmission window corresponding to the shape of the object to be transferred; aligning the alignment mark formed on the second substrate to the alignment mark formed on the masking substrate; adhering the first and the second substrates via an adhesive agent applied on the portion of the object to be transferred; irradiating a laser via the masking substrate to the object to be transferred and transferring the object to be transferred from the first substrate; and separating the first and the second substrates and transferring the object to be transferred to the second substrate.

In this arrangement, alignment with a higher degree of accuracy is achieved.

Preferably, the masking substrate includes a unit to branch the laser beam into a plurality of beams, and a plurality of windows to allow the plurality of split laser beams to pass, respectively. Accordingly, the object to be transferred may be transferred to a plurality of regions simultaneously. Preferably, the branching unit includes a diffraction grating or a plurality of optical fibers. Furthermore, by combining the plurality of optical fibers and the optical switch, laser beam can be irradiated onto a desired region, or a desired plurality of regions. Accordingly, the object to be transferred on selected one or plurality of regions of the plurality of regions may be transferred simultaneously.

BRIEF DESCRIPTION OF THE DRAWINGS

FIG. 4(a) illustrates an original substrate, and FIG. 4(b) illustrates an example of a destination substrate;

DETAILED DESCRIPTION OF PREFERRED EMBODIMENTS

An exemplary embodiment of the present invention is discussed below with reference to the drawings.

Figure 1:
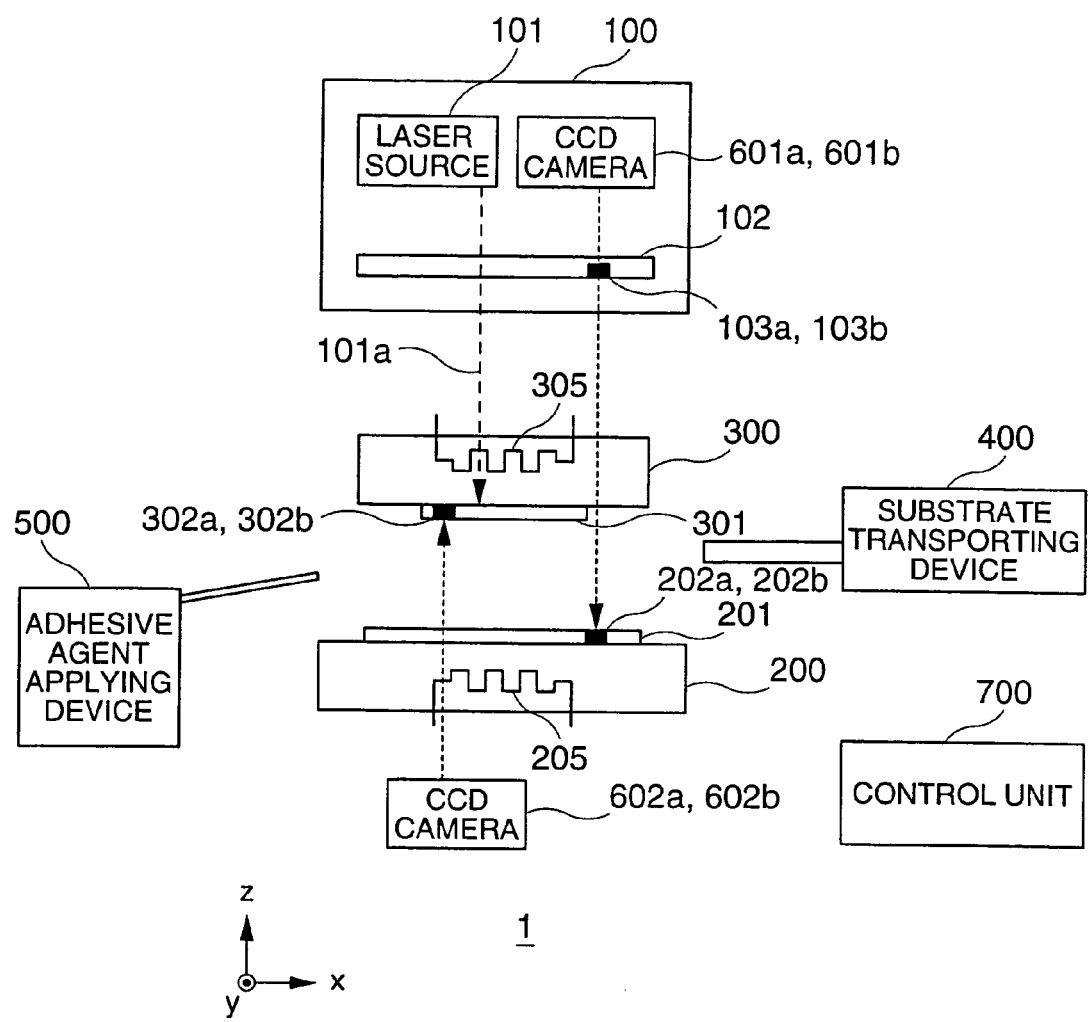
FIG. 1 is a schematic illustrating an apparatus for manufacturing electronic devices according to the present invention.

FIG. 1 is a schematic illustrating an apparatus for manufacturing electronic devices in which the electronic device is assembled according to the inter-substrate transfer technology according to the present invention.

As shown in the same drawing, a manufacturing apparatus 1 generally includes an optical unit 100 to emit a laser for transfer, an A stage 200 to place a destination substrate, a B stage 300 to place an original substrate, a substrate transporting unit 400 to transport the substrate to each stage, an adhesive agent applying unit 500 to partially apply an adhesive agent onto any one of substrates, CCD cameras 601a, 601b, 602a, and 602b to detect a mark to adjust alignment of the original substrate and the destination substrate, and a control unit 700 including a computer system to control the manufacturing process.

The optical unit 100 is secured to a frame, not shown, and includes a laser source 101 to generate a laser beam 101a to perform transfer, a replaceable mask 102 to define a spot shape of the laser beam 101a passing therethrough, and upper CCD cameras 601a and 601b to adjust alignment of the mask 102 and a later described original substrate 301.

Figure 2:
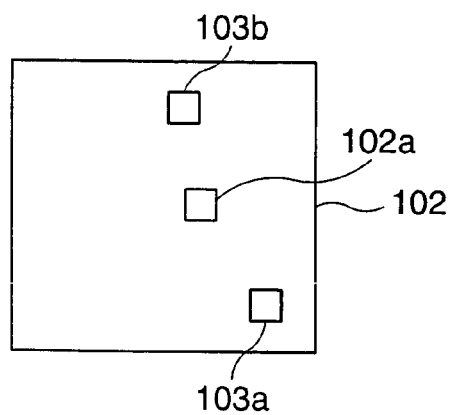
FIG. 2 is a schematic illustrating an example of a mask used in the apparatus for manufacturing electronic devices.

As shown in FIG. 2, the mask 102 includes a through port 102a formed on a substrate to shape the spot shape of the laser beam 101a so as to coincide with the shape of a region to be transferred on the substrate. Alignment marks 103a and 103b are formed on arbitrary two positions on the substrate. As described below, the mask 102 is not limited to an example shown in the figure, but may be selected from various types for use.

The A stage 200 is used to place and fix a destination substrate 201, which is transported by the substrate transporting unit 400, on the upper surface of a bed. For example, the destination substrate 201 is fixed and stuck on the surface of the substrate by applying a negative pressure by vacuum, and is released from fixation by switching the pressure of vacuum to zero or to a positive pressure. A heater 205 to maintain the temperature of the substrate constant and a temperature sensor 204 (See FIG. 5) to detect temperatures of the A stage are arranged in the A stage 200. The A stage 200 includes various actuators, such as a pulse motor, integrated therein, and is capable of moving in the direction of an X-axis (lateral direction), in the direction of a Y-axis (near-far direction), in the direction of a Z-axis (vertical direction), and about a Z-axis in the direction of an rotational angle $\theta$ in the drawing. The A stage 200 is controlled by a control unit 700 in terms of position, posture, action, and so on. The destination substrate 201 is formed with alignment marks 202a and 202b at two positions. The destination substrate 201 is a flexible film substrate of organic material or a plastic substrate, which is cutout into an IC card.

Figure 3:
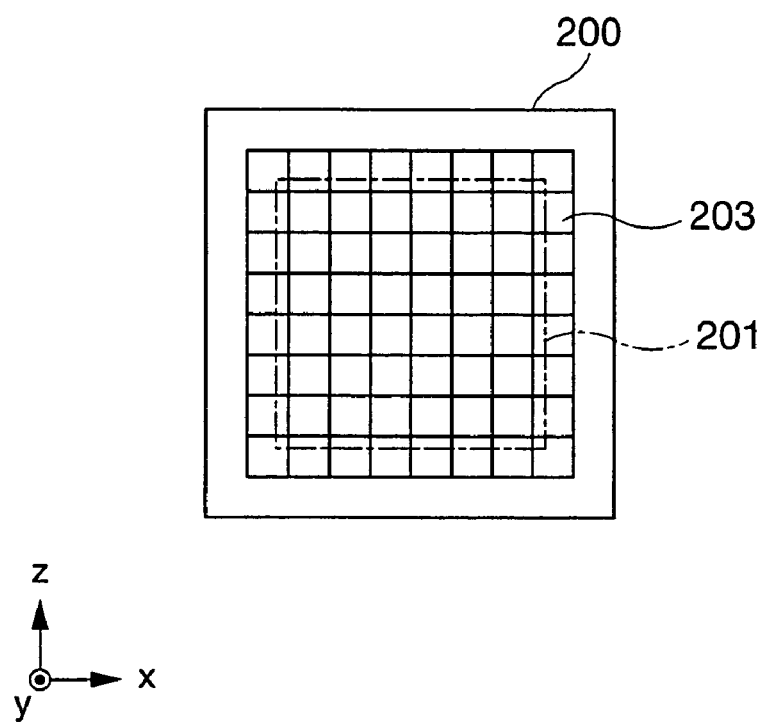
FIG. 3 is a schematic illustrating an example of an A stage.

As shown in FIG. 3, a sensor array 203 to detect and correct deflection or roughness on the destination substrate 201 is arranged on the surface of the A stage on which the destination substrate 201 is placed. Each unit element of the sensor array 203 detects the pressure (weight) and causes minute expansion and contraction. Although it is not limited thereto, for example, the unit element, being constructed of a piezoelectric element, converts the applied weight at each portion into an electric signal, detects the converted signal, and causes minute expansion and contraction in the vertical direction at prescribed portions by applying the applied voltage to the piezoelectric element. Accordingly, deflections or distortions of the flexible destination substrate 201, which is placed on the A stage 200, can be adjusted (removed).

The B stage 300 is used to place and fix the original substrate 301, which is transported by the substrate transporting unit 400, on the lower surface of the bed. For example, the original substrate 301 is fixed and stuck on the surface to be placed by applying a negative pressure by vacuum, and is released from fixation by switching the pressure of vacuum to zero or to a positive pressure. The substrate transporting unit 400 includes various actuators, such as a pulse motor, integrated therein, and is capable of moving in the direction of an X-axis (lateral direction), in the direction of a Y-axis (near-far direction), and about a Z-axis (vertical direction) in the direction of an rotational angle $\theta$ in the drawing. The substrate transporting unit 400 is controlled by the control unit 700 in terms of action. The B stage 300 includes a heater 305 to maintain the temperature of the substrate constant and a temperature sensor 304 (See FIG. 5) to detect the temperature of the B stage therein. Alignment marks 302a and 302b are formed at two positions on the original substrate 301. The original substrate 201 is, for example, a glass substrate. A thin film element, a thin film circuit, or a thin film device (thin film sensor, liquid crystal display, organic EL display, and so on) to be transferred are formed thereon.

A frame, not shown, below the A stage is provided with lower CCD cameras 602a and 602b. The cameras 602a and 602b are used mainly to adjust alignment between the destination substrate 201 and the original substrate 301.

Figure 4:
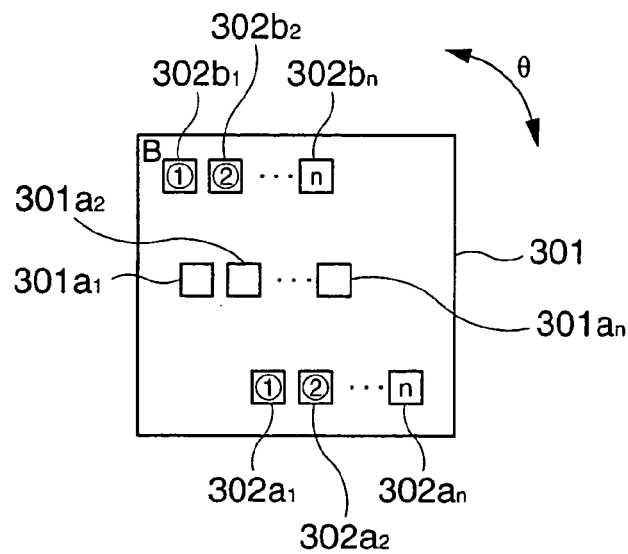
FIGS. 4(a) and 4(b) are schematics illustrating adjustment of alignment, where
Figure 4:
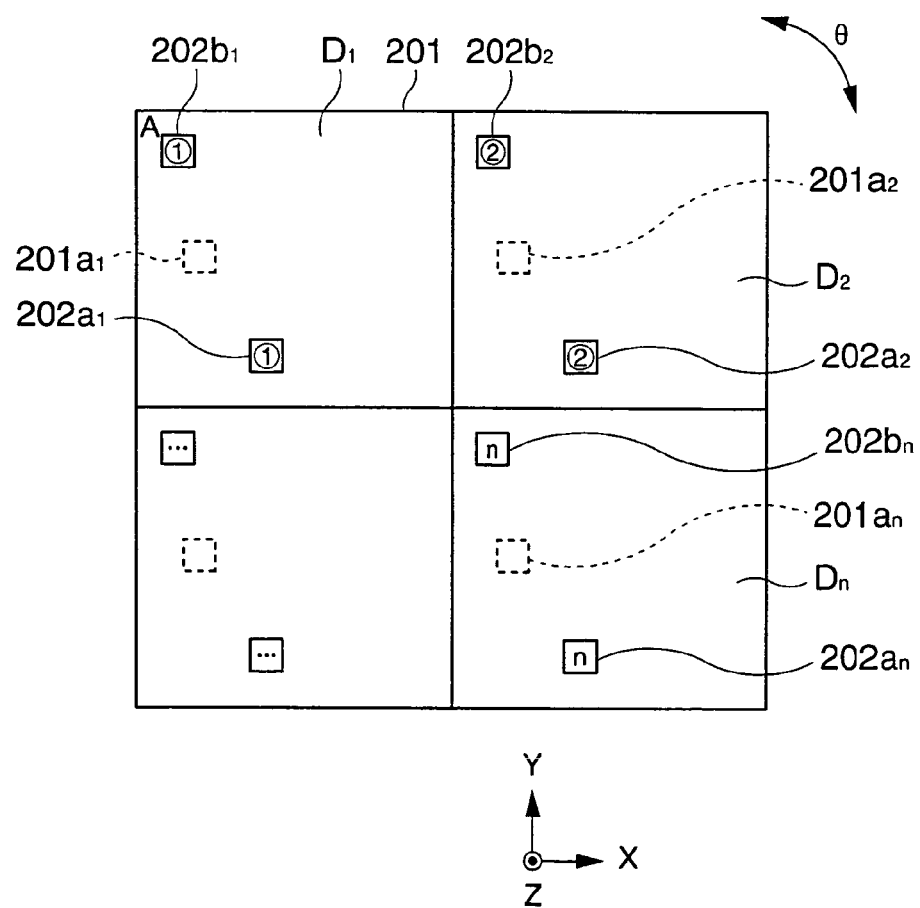

FIGS. 4(a) and 4(b) show an example of alignment marks formed on the respective substrates. In the example shown in the drawings, the positions to which the thin film elements or circuits are transferred are transferred in sequence to the respective regions on the destination substrate 201 by step-by-step action of the A stage. FIG. 4(a) shows an example of the original substrate 301, and alignment marks $302a_1, \ldots, 302a_n, 302b_1, \ldots, 302b_n$ are formed at the positions corresponding to the objects to be transferred $301a_1, \ldots, 301a_n$, such as a thin film element or a thin film circuit, and the like. FIG. 4(b) shows an example of the destination substrate 201, in which alignment marks $202a_1, \ldots, 202a_n, 202b_1, \ldots, 202b_n$ are formed corresponding to the positions to be transferred $201a_1, \ldots, 201a_n$. Therefore, by moving the A stage 200 and the B stage 300 as needed and aligning the alignment marks $302a_1$ and $302b_1$ of the original substrate 301 and the alignment marks $202a_1$ and $202b_1$ on the destination substrate 201, the object to be transferred $301a_1$ is positioned at the position to be transferred $201a_2$. The object to be transferred $301a_2$ is positioned to the position to be transferred $201a_2$ by aligning the alignment marks $302a_2$ and $t302b_2$ of the original substrate 301 with the alignment marks $202a_2$ and $202b_2$ of the destination substrate 201. In the same manner, by aligning the alignment marks $302a_n$ and $302b_n$ of the original substrate 301 and the alignment marks $202a_n$ and $202b_n$ on the destination substrate 201, the object to be transferred $301a_n$ is positioned at the position to be transferred $201a_n$. As described below, arrangement of the alignment mark is not limited to this example. There are various modes of arrangement according to the object, such as the case of transferring a plurality of objects to be transferred in the same region.

The adhesive agent applying unit 500 applies an adhesive agent on the region of the thin film element or the thin film circuit, which is an object to be transferred, on any substrates, for example, the original substrate 301. It is also possible to apply an adhesive agent on the region to be transferred on the destination substrate 201. For this application of an adhesive agent, the substrate 301 (or 201) is transported by the substrate transporting unit 400, or is transferred by the movement of the B stage 300 (or the A stage 200) to the position of the adhesive agent applying unit 500. It is also possible to move the adhesive agent applying unit 500 and apply an adhesive agent on the object to be transferred, or on the position to be transferred, on the corresponding destination substrate.

Figure 5:
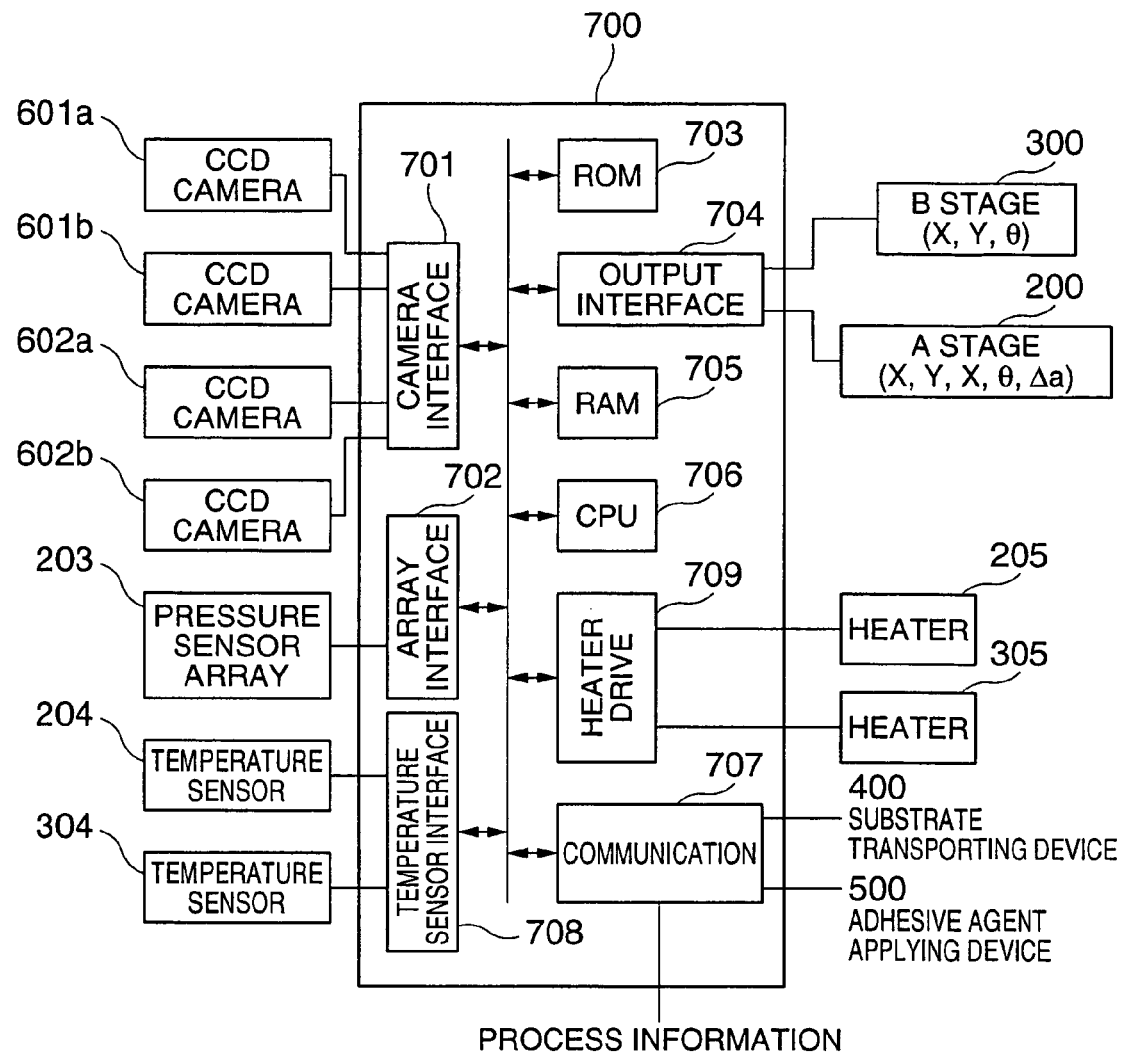
FIG. 5 is a schematic illustrating a control system of the apparatus for manufacturing electronic devices.

As shown in FIG. 5, the control unit 700 includes a camera interface 701, which recognizes the pattern of each image output from the CCD cameras 601a, 601b, 602a, and 602b, and writes the results into a predetermined area in a RAM 705, an array interface 702, which converts output signals from the pressure sensor array 203 into data and writes them on a predetermined area in the RAM, and a temperature sensor interface 708, which converts the output signals from the temperature sensor 204 disposed on the A stage 200 and the temperature sensor 304 disposed on the B stage 300 into data and writes them in a predetermined area in the RAM. There may be a plurality of temperature sensors on each stage. A CPU 706 executes a control program stored in a ROM 703, and executes various controls or exchanges process information with other devices. For example, as is described below, the CPU 706 performs information processing based on the outputs of read marks from the CCD cameras, controls a driving circuit of the output interface 704, actuates the actuators in the A stage 200 and in the B stage 300 to control the positions or the postures of the respective stages, so that adjustment of inter-substrate alignment is achieved. The CPU 706 makes the substrate transporting unit 400 perform carrying-in, moving, and carrying-out of the substrate via a communication interface 707 depending on the stage of the manufacturing process. Furthermore, the CPU 706 makes the adhesive agent applying unit 500 apply an adhesive agent onto the substrate via the communication interface 707. In addition, the CPU 706 controls a heater driving unit 709 based on the output signals from the temperature sensors 204 and 304 disposed on the respective stages, and controls the temperatures of the respective stages to be maintained at temperatures predetermined therefor.

Referring to FIG. 6 to FIG. 18, inter-substrate transfer process of a thin film element or a thin film circuit by the manufacturing apparatus 1 is described below. Throughout these drawings, components that are the same as or corresponding to the components shown in FIG. 1 are designated by the same reference numerals, and those components are not described.

(1) Setting of a Mask

Figure 6:
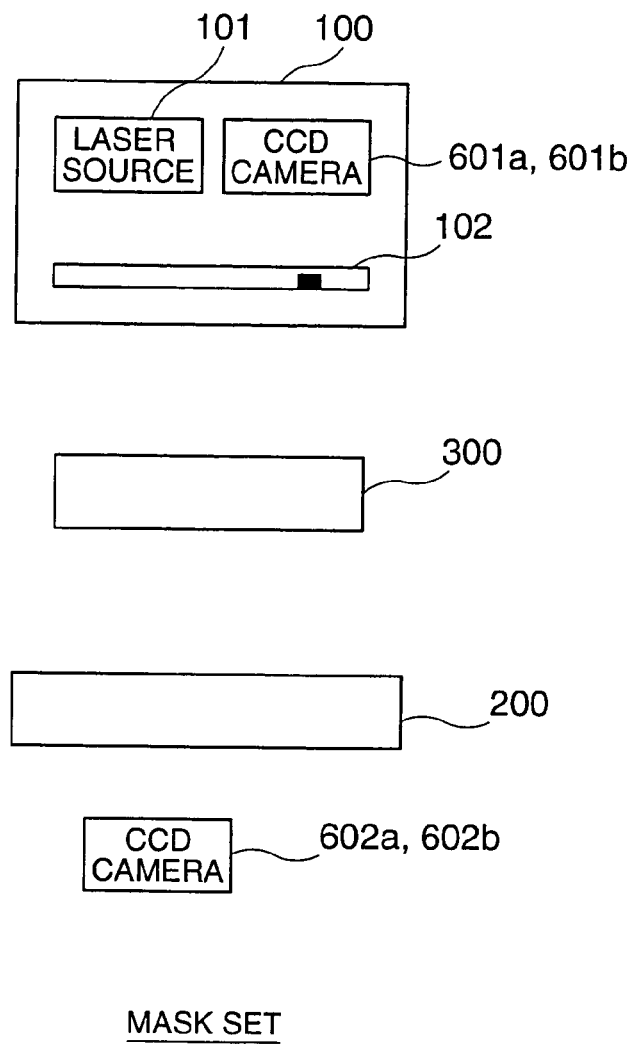
FIG. 6 is a schematic illustrating a mask set in the manufacturing process.

As shown in FIG. 6, the CPU 706 receives information on the mask 102, the destination substrate 201, and the original substrate 301, which is used as process information, selects a corresponding mask 102 from a plurality of masks provided in advance by the mask transporting device, not shown, and sets the selected mask to the optical unit 100. The mask 102 sets the position to irradiate the laser beam 101*a* and the shape of the beam spot as described above.

(2) Setting of a Destination Substrate/Adjustment of Alignment

Figure 7:
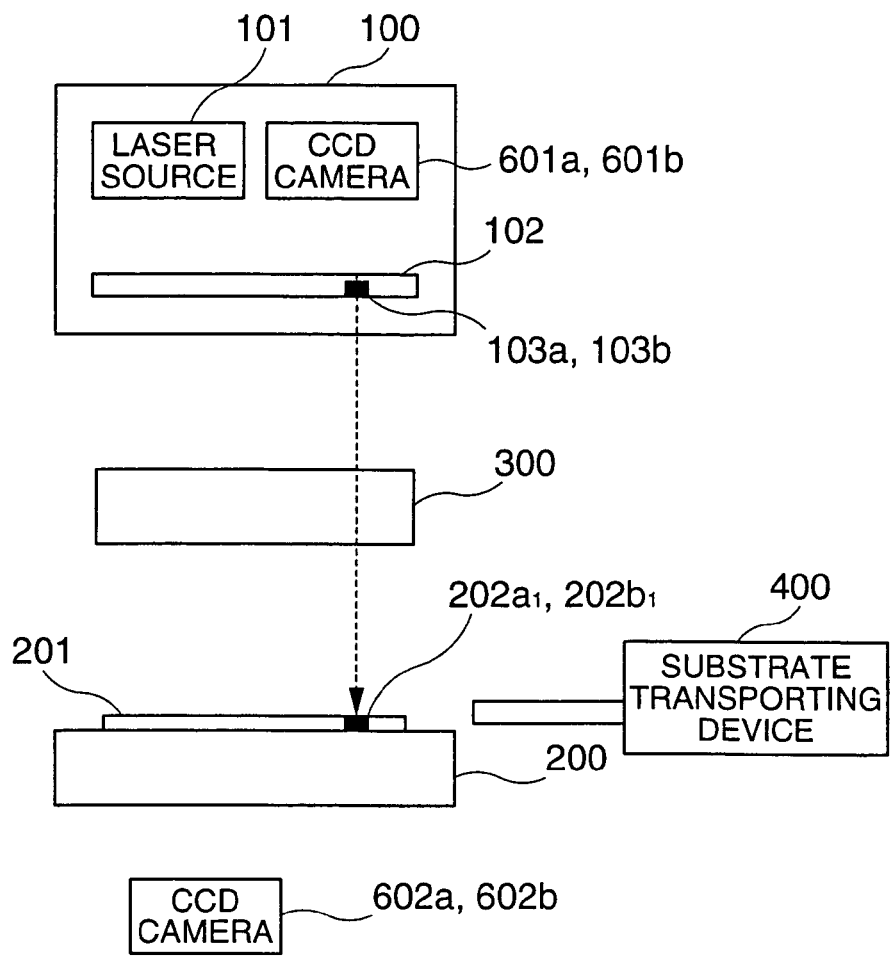
FIG. 7 is a schematic illustrating loading and adjustment of alignment of the destination substrate in the manufacturing process.

As shown in FIG. 7, the CPU 706 gives an instruction to the substrate transporting unit 400 to transport the destination substrate 201 to a predetermined position on the A stage 200, and fixes it on the A stage 200 by a negative pressure. Then the CPU 706 moves the CCD cameras 601*a* and 601*b* disposed above to the position exactly facing the alignment marks 103*a* and 103*b* of the mask 102, or predetermines the positions of the CCD cameras 601*a* and 601*b* so that the positions of the CCD cameras 601*a* and 601*b*, and the alignment marks 103*a* and 103*b* of the mask 102 are aligned. The CCD cameras 601*a* and 601*b* read the alignment marks 103*a* and 103*b* on the mask 102, and the alignment marks 202*a* and 202*b* on the transfer substrate 201. The CPU 706 adjusts the position of the A stage 200 (X, Y, θ) so that the alignment marks 202*a* and 202*b* of the destination substrate 201 exactly overlap the alignment marks 103*a* and 103*b* of the mask 102. Accordingly, alignment between the mask (position to be transferred by irradiation of a laser beam) 102 and the destination substrate 201 is adjusted.

(3) Application of an Adhesive Agent on the Original Substrate

Figure 8:
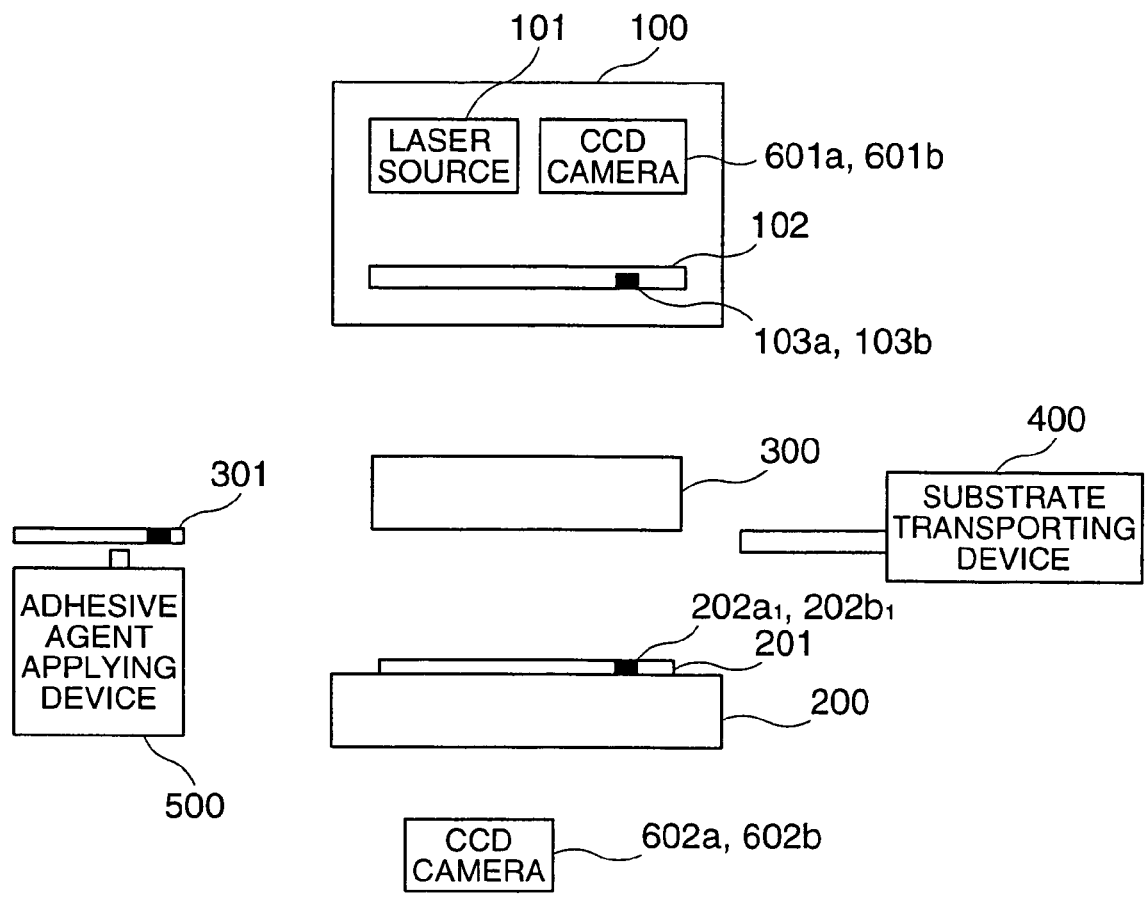
FIG. 8 is a schematic illustrating application of an adhesive agent on the original substrate in the manufacturing process.

As shown in FIG. 8, the substrate transporting unit 400 transports the original substrate 301 to the adhesive agent applying unit 500, where an adhesive agent is applied to the portion of the thin film element or the thin film circuit that is to be transferred.

Figure 9:
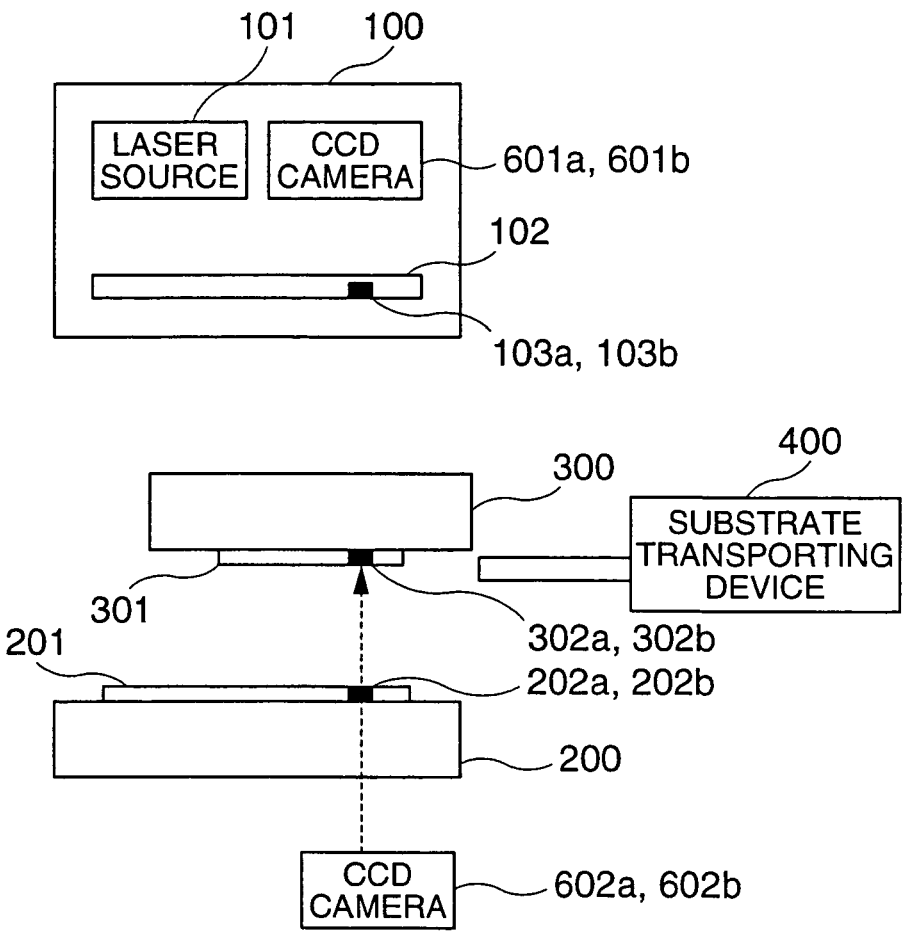
FIG. 9 is a schematic illustrating adjustment of alignment of the original substrate in the manufacturing process.

(4) Adjustment of Alignment Between the Original Substrate and the Destination Substrate As shown in FIG. 9, the substrate transporting unit 400 transports the original substrate 301 applied with an adhesive agent to the B stage 300 and fixes it to the lower surface by a negative pressure. The position of the B stage (X, Y, θ) is adjusted by moving the lower CCD cameras 602*a* and 602*b* to the position exactly facing the position of the alignment mark on the destination substrate 201 so that the alignment marks 202*a* and 202*b* on the destination substrate 201 exactly overlap the alignment marks 302*a* and 302*b* of the original substrate 301. Accordingly, alignment among the mask 102, the destination substrate 201, and the original substrate 301 is adjusted.

(5) Adjustment of Detection of Distortion and Inclination

Figure 10:
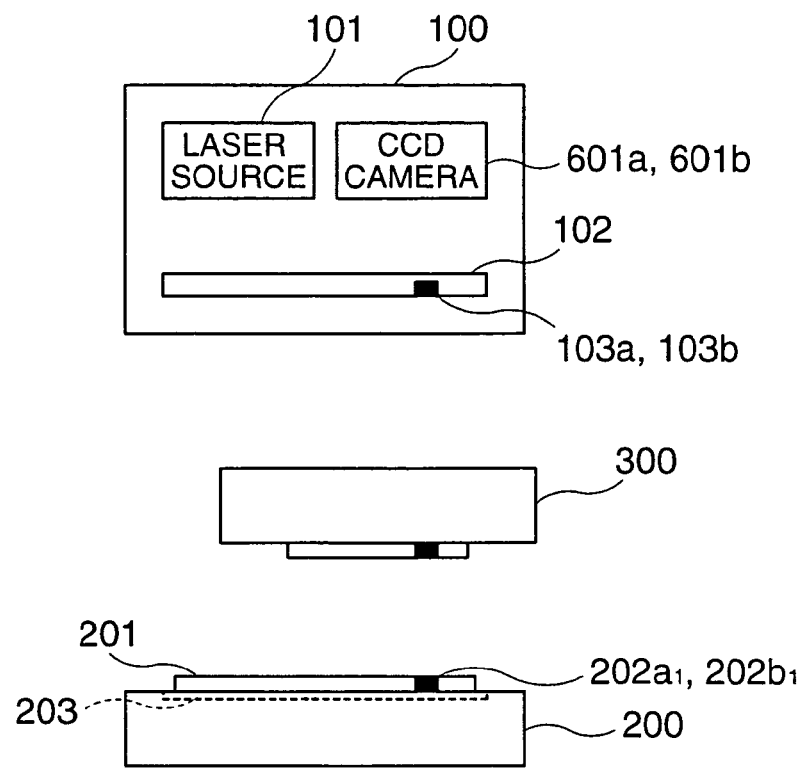
FIG. 10 is a schematic illustrating detection/adjustment of inclination or distortion of the destination substrate in the manufacturing process.

Furthermore, adjustment of distortion and inclination of the destination substrate 201 as shown in FIG. 10 is performed as needed. It is effective when using substrates that are liable to bend.

The CPU 706 obtains the distribution of the pressure (gravity) from the output of the detecting elements located on the respective positions on the sensor array 203, on which the destination substrate 201 is placed, and determines distortion and inclination of the destination substrate 201. Based on the determined result, the CPU 706 drives the elements on the array 203 to compensate distortion and inclination, and controls the minute unevenness on the surface of the A stage 200 to maintain the destination substrate 201 even.

(6) Adhesion of Substrates/Laser Irradiation

Figure 11:
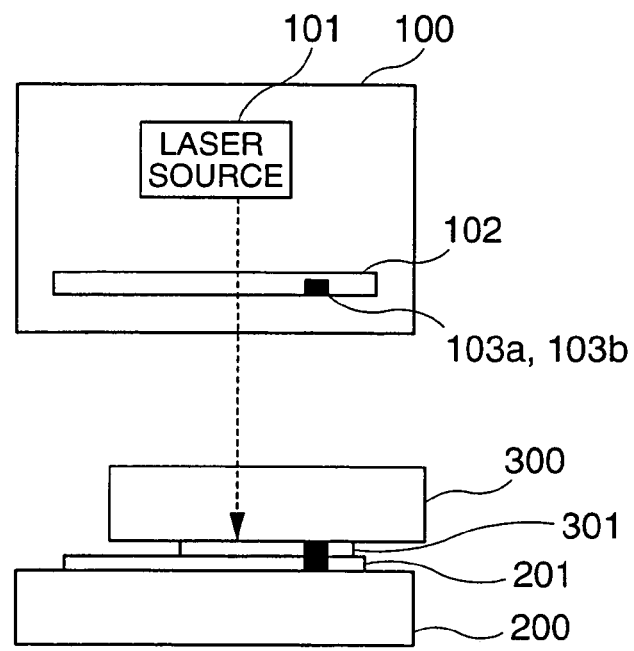
FIG. 11 is a schematic illustrating adhesion/laser irradiation between the original substrate and the destination substrate in the manufacturing process.

As shown in FIG. 11, the CPU 706 moves the A stage 200 upward and brings the destination substrate 201 and the original substrate 301 into close contact with each other partially via an adhesive agent. An adhesive force is detected by the sensor 203 and the like and maintained in a suitable clamping force. The CPU 706 actuates a laser source, and irradiates only the region of the thin film element or the thin film circuit to be transferred via the mask 102 from the backside of the (glass) substrate 301. Accordingly, laser abrasion occurs in the transferring film and thus peeling occurs in the irradiated region.

(7) Transfer

Figure 12:
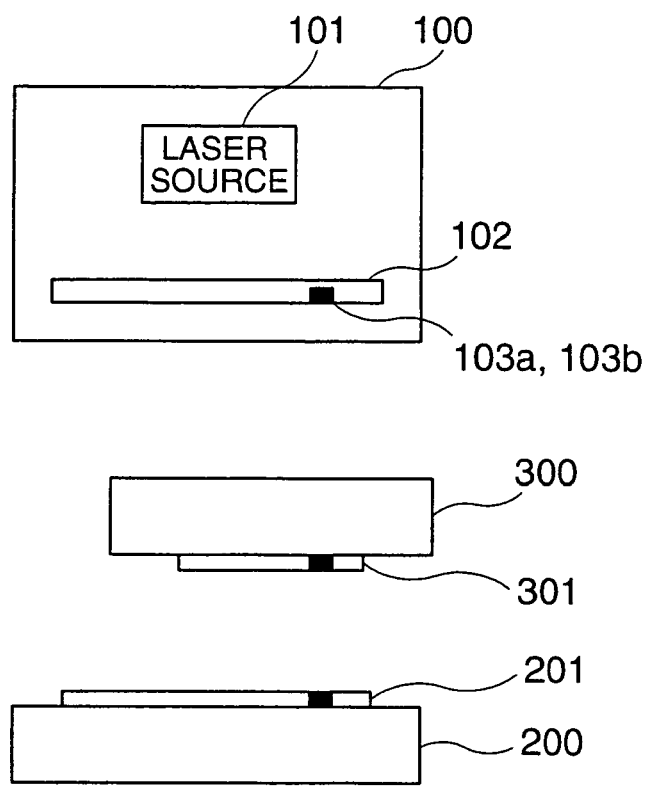
FIG. 12 is a schematic illustrating peel and transfer in the manufacturing process.

As shown in FIG. 12, the CPU 706 moves the A stage 200 downward after a predetermined time period, which is required to cure the applied adhesive agent, has passed, and transfers the region of the thin film element or the thin film circuit to be transferred from the original substrate 301, and transfers (moves) the same to the destination substrate 201.

In this manner, the first transfer operation is completed.

(8) Application of an Adhesive Agent on the Original Substrate

Figure 13:
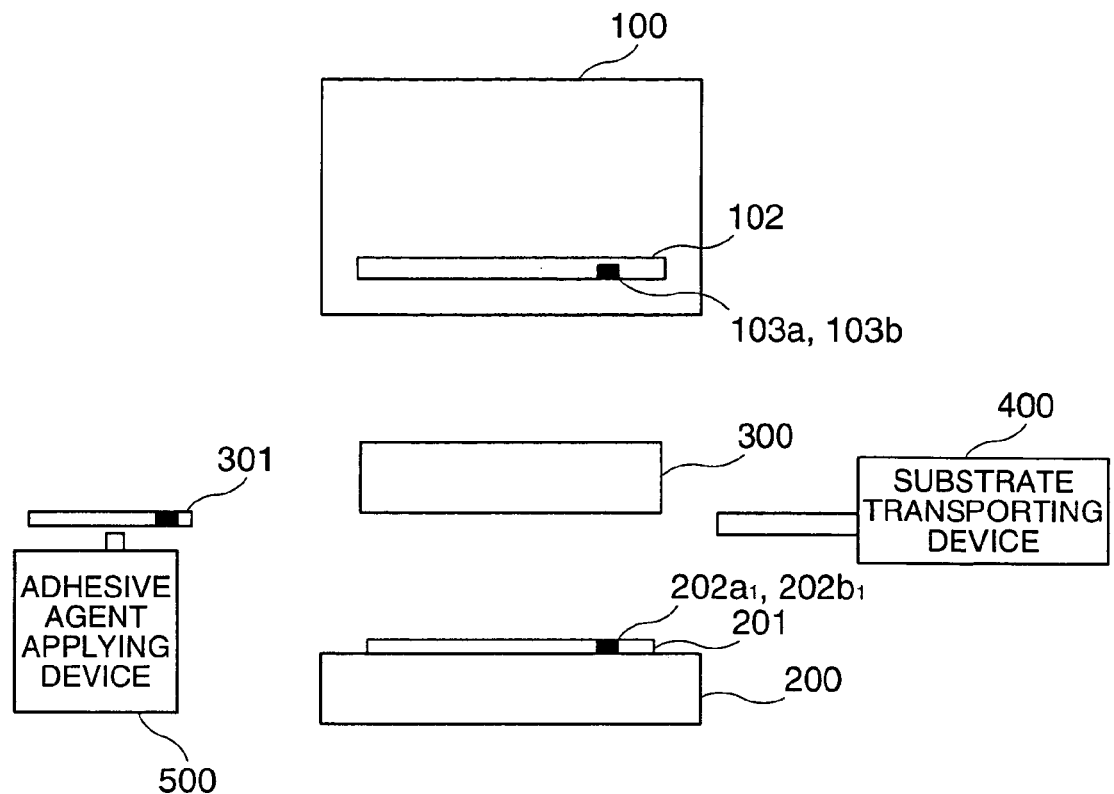
FIG. 13 is a schematic illustrating application of an adhesive agent on the original substrate in the manufacturing process.

Subsequently, as shown in FIG. 13, the CPU 706 makes the substrate transporting unit 400 transport the original substrate 301 to the position of the adhesive agent applying unit 500 to perform the second transfer operation. The adhesive agent applying unit 500 applies an adhesive agent to the area of a next thin film element or a thin film circuit to be transferred on the original substrate 301.

(9) Step-by-Step Movement of the Destination Substrate

Figure 14:
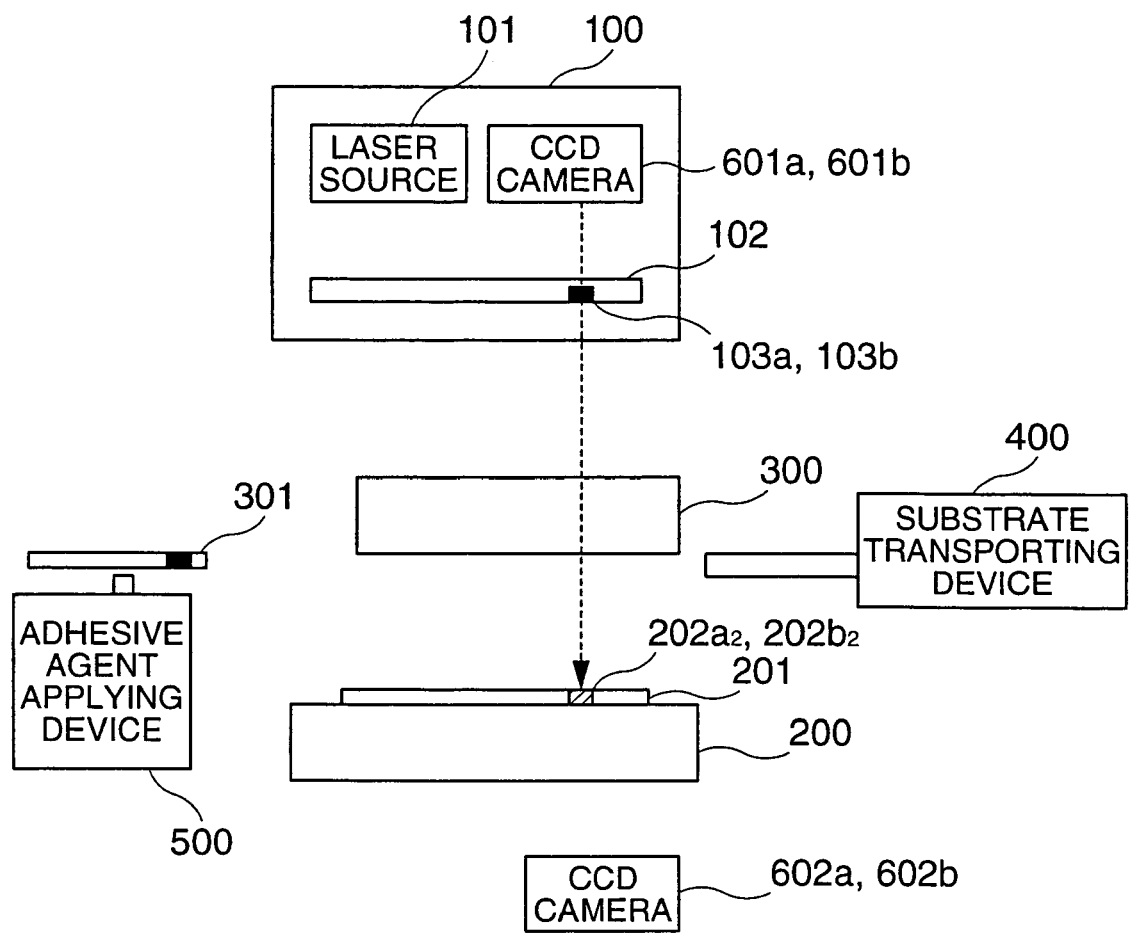
FIG. 14 is a schematic illustrating adjustment of alignment of the destination substrate in the manufacturing process.

As shown in FIG. 14, the CPU 706 moves the A stage 200 by one step, so that the region of the next object to be transferred is placed to the laser irradiation position. Therefore, the positions of the alignment marks to be used on the destination substrate 201 are switched to the alignment marks $202a_2$ and $202b_2$ of the next region. The CPU 706 moves the A stage 200 and aligns the alignment marks $202a_2$ and $202b_2$ on the destination substrate with the alignment marks 103*a* and 103*b* of the mask 102 while observing by the CCD cameras 602*a* and 602*b*. With this operation, the destination substrate 201 moves to the position to be transferred in the next region.

Figure 15:
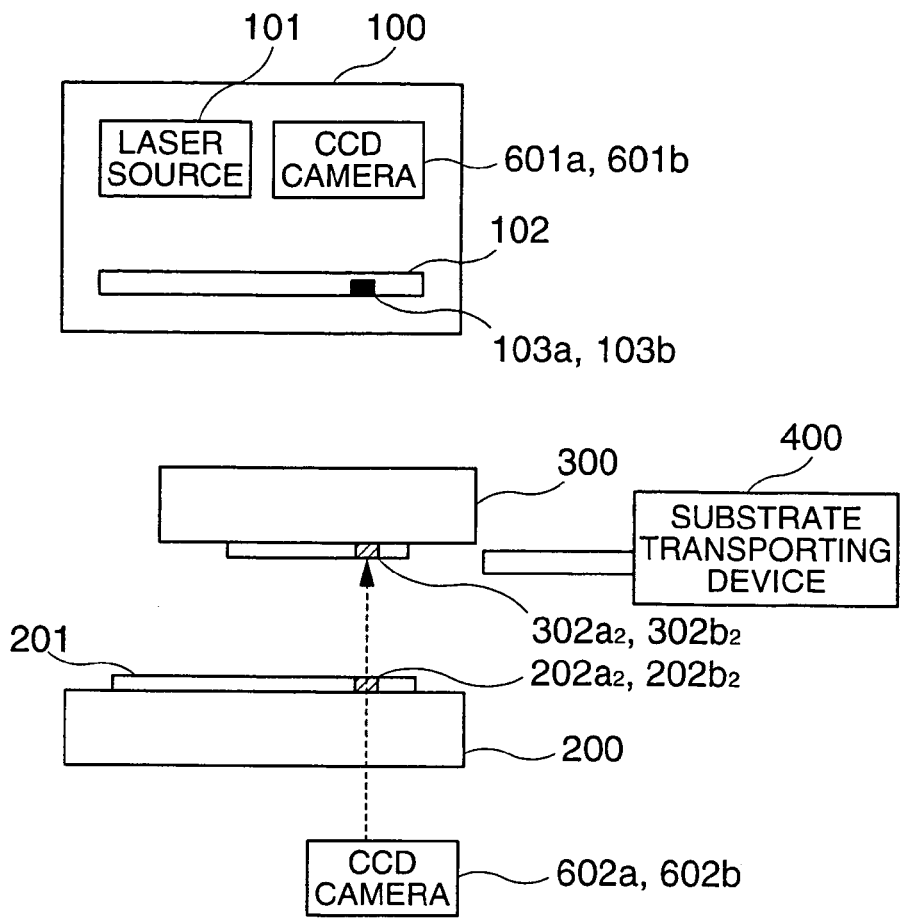
FIG. 15 is a schematic illustrating adjustment of alignment of the original substrate in the manufacturing process.

(10) Adjustment of Alignment Between the Original Substrate and the Destination Substrate As shown in FIG. 15, the CPU 706 makes the substrate transporting unit 400 transport the original substrate 301, on which an adhesive agent is applied, and place the same under the B stage 300.

The CPU 706 observes the alignment marks $202a_2$ and $202b_2$ on the destination substrate 201 and the alignment mark $302a_2$ and $302b_2$ of the original substrate 301 by CCD cameras 602a and 602b, adjusts the position of the B stage 300, and aligns the alignment marks $302a_2$ and $302b_2$ with the alignment marks $202a_2$ and $202b_2$. Accordingly, the laser irradiation position 102a of the mask 102, the position to be transferred $201a_2$ on the destination substrate 201, and the object to be transferred $301a_2$ on the original substrate 301 coincide in the direction of the Z-axis.

(11) Detection and Adjustment of Distortion and Inclination

Figure 16:
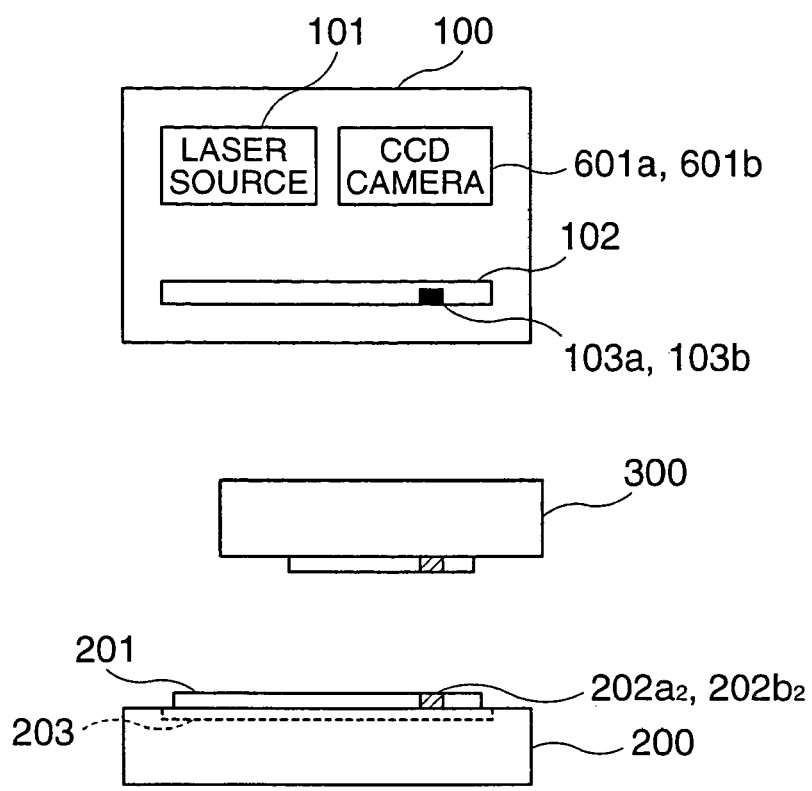
FIG. 16 is a schematic illustrating detection/adjustment of inclination or distortion in the destination substrate in the manufacturing process.

As shown in FIG. 16, adjustment of distortion and inclination of the destination substrate 201 is performed as needed. It is effective when using a film substrate that is liable to bend. The CPU 706 obtains the distribution of the pressure (gravity) based on the outputs from the detection elements at the respective positions on the sensor array 203, on which the destination substrate 201 is placed, and determines deflection or inclination of the destination substrate 201. Based on the result of the determination, the CPU 706 drives the element of the array 203 so as to compensate the deflection or inclination of the substrate, and controls minute roughness of the surface of the A stage 200, so as to maintain the destination substrate 201 even.

(12) Adhesion of Substrates/Irradiation of Laser Beam

Figure 17:
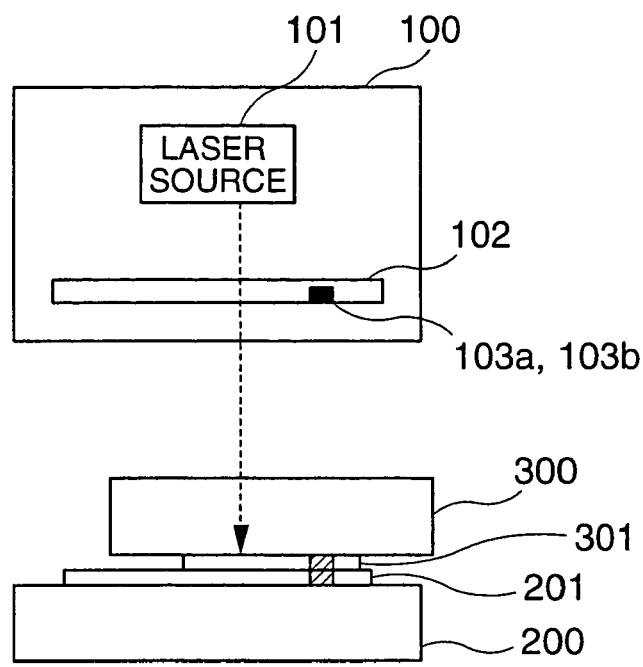
FIG. 17 is a schematic illustrating adhesion/laser irradiation between the original substrate and the destination substrate in the manufacturing process.

As shown in FIG. 17, the CPU 706 moves the A stage 200 upward, and brings the destination substrate 201 and the destination substrate 301 into close contact with each other partially via an adhesive agent. An adhesive force is detected by the sensor 203 and the like and maintained to a suitable clamping force. The CPU 706 moves the laser source 101, and irradiates only the region of the thin film element or the thin film circuit of the object to be transferred $301a_2$ via the mask 102 from the backside of the (glass) substrate 301. Accordingly, laser abrasion occurs in the transferring film and thus peeling occurs in the irradiated region on the substrate 301.

(13) Transfer

Figure 18:
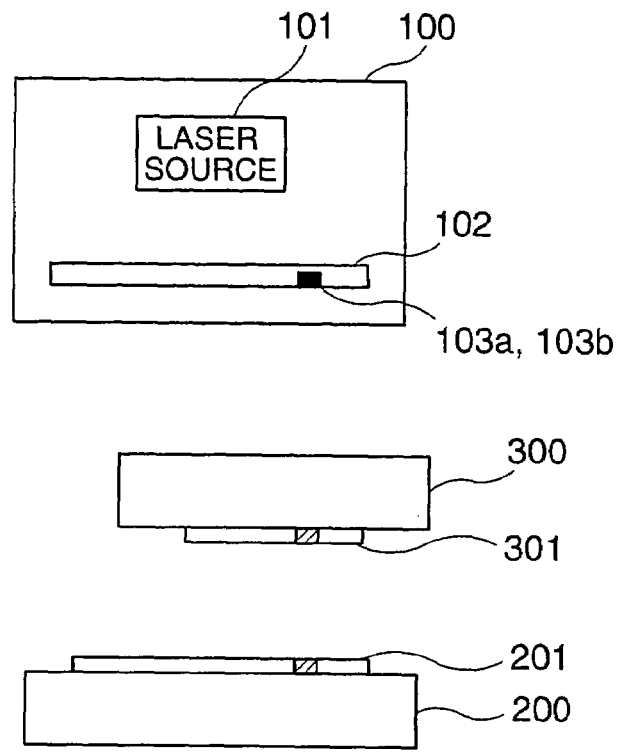
FIG. 18 is a schematic illustrating peel and transfer in the manufacturing process.

As shown in FIG. 18, the CPU 706 moves the A stage 200 downward after a predetermined time period, which is required to cure the adhesive agent, has passed, and transfers the region of the thin film element or the thin film circuit of the object to be transferred $301a_2$ from the original substrate 301, and transfers (moves) the same to the position to be transferred $201a_2$ on the destination substrate 201.

In this manner, the second peel and transfer operation is completed.

(14) N-Times Transfer

In the same manner, the procedures from (8) to (13) described above are repeated, and inter-substrate transfer of the thin film element or the thin film circuit by the required number of times, so that the thin film element or the thin film circuit formed on the original substrate 301 is transferred to the respective predetermined positions on the destination substrate 201 in sequence.

(15) Unloading of the Substrate

The destination substrate 201 after transfer operation has completed is transported by the substrate transporting unit 400 to the next process. From the next process on, bonding, packaging, or cutting out of the transferred thin film element or the thin film circuit and, for example, an IC card is assembled. The original substrate 301 after transfer operation has completed is also transported by the substrate transporting unit 400 to a collecting container. The original substrate 301, such as a quartz glass substrate, is reused.

In this manner, according to the exemplary embodiment described above, it is possible to perform a process including a heat process in the manufacturing process on a separate substrate, and perform a process of adhering it onto a substrate, which is low in heat-resistance, automatically by the assembling device without forming the element circuit and the wiring circuit on the same substrate.

It is advantageous that the thin film circuits, which are different in designing rules, such as width of the drawing line of the pattern, can be formed on the separate substrates and, after transfer operation, assembled, automatically on a single substrate. For example, it is possible to form a thin film circuit, formed of drawing lines narrower than those of the pattern on the destination substrate, on the destination substrate.

Since minute part transfer and adhesion can be made by the laser device and the adhering device, aligning with the flexible material or the like with a high degree of accuracy is easily realized.

It is also possible to accommodate upsizing of the substrate by repeating transfer and adhering operation by a plurality of times.

Figure 19:
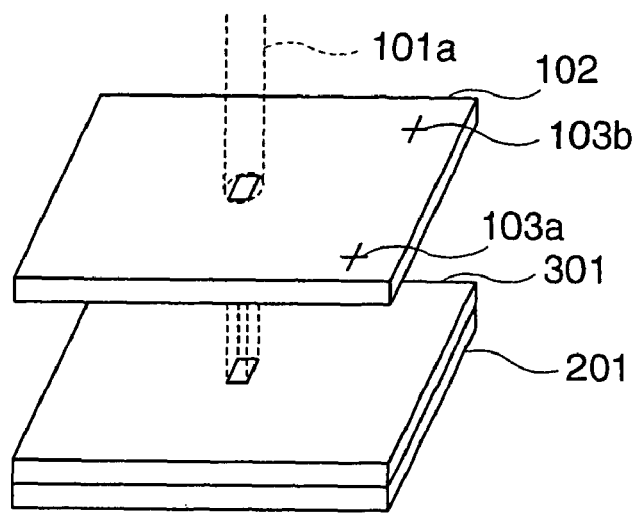
FIG. 19(a) is a schematic illustrating an example of a selecting mask to select a region to irradiate a laser beam.
FIG. 19(b) is a schematic illustrating an example of branching the laser beam into an array by a diffraction grating mask.
Figure 19:
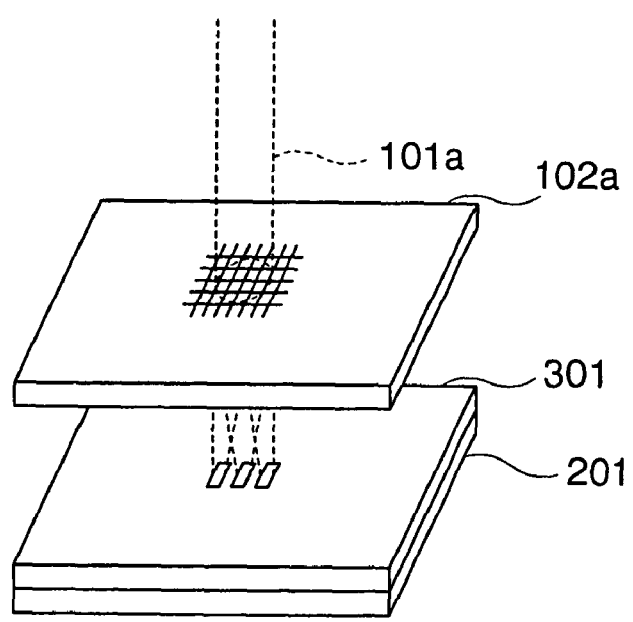

FIG. 19(*a*) to 21 show an example of the construction of an optical system. FIG. 19(*a*) shows an example in which the number of mask holes used in the exemplary embodiment described above is one. The spot shape of the laser beam 101a is shaped by the shape of the mask hole so that a laser beam corresponding to the shape of the thin film active electronic element or the thin film circuit to be transferred is obtained.

FIG. 19(*b*) shows an example in which a single beam 101a is split into a plurality of beams and irradiated to the original substrate 301 using the diffraction grating 102a. Accordingly, by applying an adhesive agent on a plurality of regions to be transferred in advance and irradiating simultaneously a plurality of regions, a plurality of active electronic elements or thin film circuits can be transferred from the original substrate 301 to the destination substrate 201.

Figure 20:
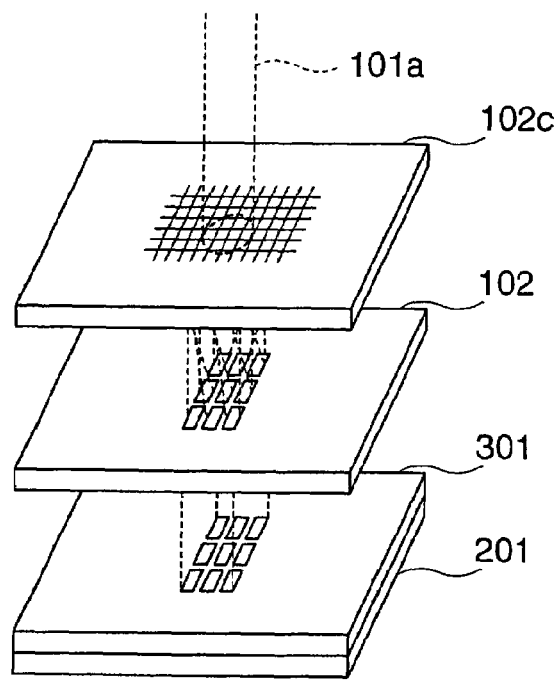
FIG. 20 is a schematic illustrating an example in which the laser beam is branched into an array by the diffraction grating mask and then forming the shape of the beam spot by the shape of the hole formed on the region selecting mask.

FIG. 20 shows an example in which a single beam 101a is split into a plurality of beams by a diffraction grating mask 102c, and an array of beams are irradiated onto the original substrate 301 via the mask 102 formed with a plurality of holes. Accordingly, the spot shape of each beam can be shaped more accurately, and a plurality of regions can be peeled and transferred simultaneously from the original substrate 301 to the destination substrate 201.

By using the mask in this manner, a beam from minute spot size (μm) to original size (mm) can be obtained from a single unit of laser device. In addition, by providing a plurality of masks, the shape of the beam spot can be selected as desired by changing the mask. In addition, the position of the block irradiation or the number of blocks to be irradiated can advantageously be selected.

Figure 21:
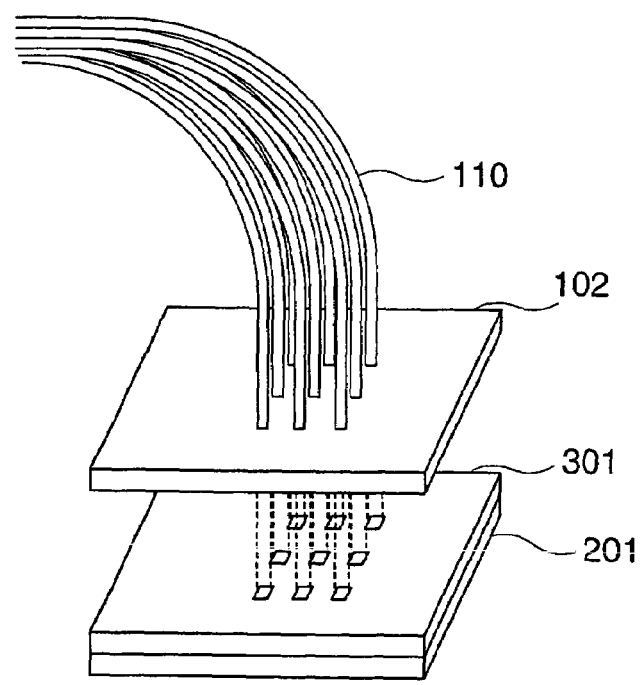
FIG. 21 is a schematic illustrating an example in which the laser beam is guided through the optical fiber to selectively irradiate a plurality of regions.

FIG. 21 shows an example in which a laser beam is guided through a plurality of optical fibers from the laser source 101. The optical fibers are adapted to guide the beam independently by using an optical switch or the like, not shown. The shape of the beam spot is formed by the mask 102 at the extremity of the optical fiber, so that a plurality of regions are irradiated. In the example shown in the drawing, a plurality of regions to be transferred are irradiated by a plurality of optical fibers. However, it is also possible to irradiate one entire region by bundling a plurality of fibers so as to match the outline of a single region to be transferred. Alternatively, it is possible to dispose an optically system, such as a minute optical lens, at the distal end of the optical fiber. It is also possible to guide a light to the selected optical fibers to irradiate a plurality of positions simultaneously as desired.

Figure 22:
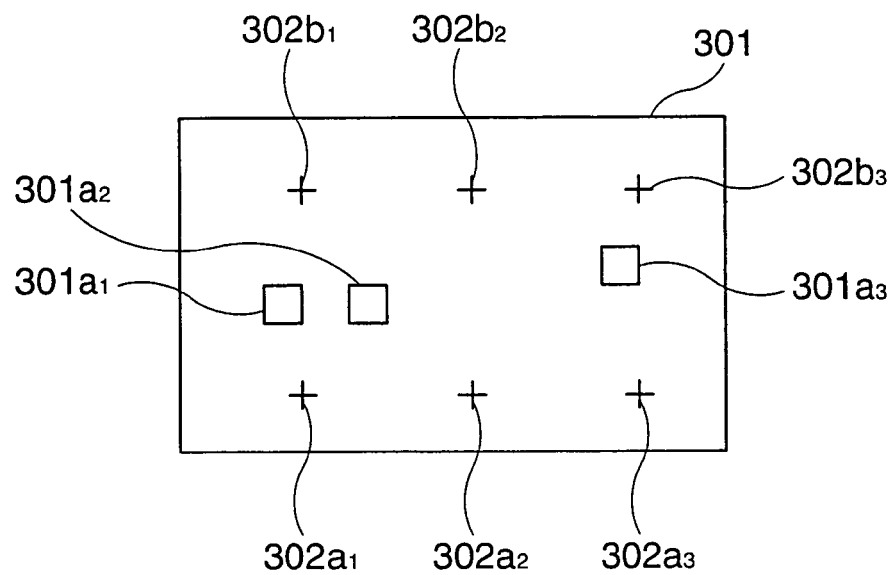
FIGS. 22(a) and 22(b) are schematics illustrating an example of arrangement of the alignment marks in the case where a plurality of objects to be transferred are transferred into the same region on the destination substrate.
Figure 22:
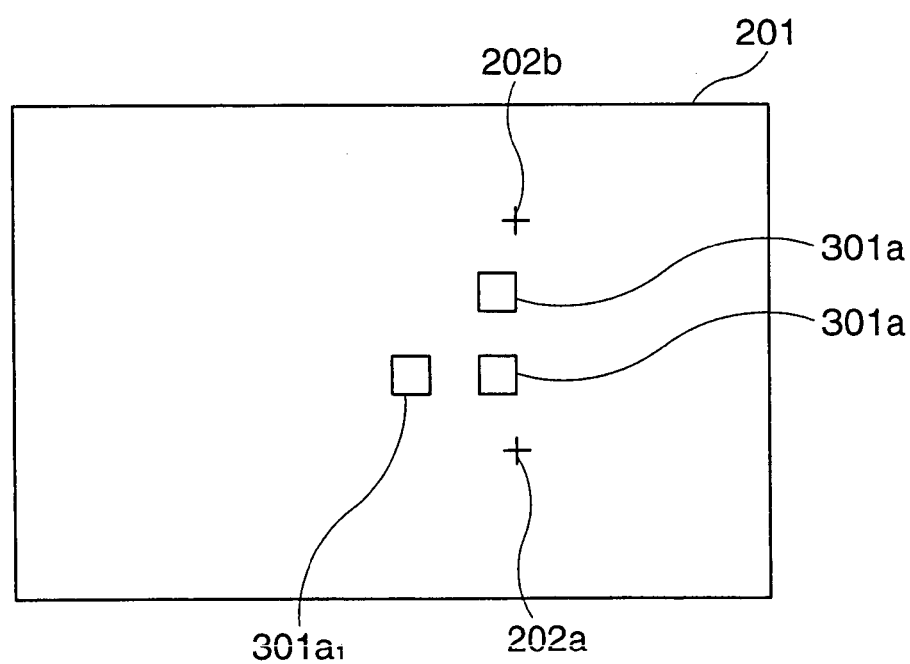

FIGS. 22(a) and 22(b) show another example of arrangement of the alignment mark. In a certain region on the destination substrate 201, for example, in a region corresponding to a single IC card or a single display, a plurality of thin film elements or thin film circuits are adhered.

In FIG. 22(a), objects to be transferred $301a_1$ to $301a_3$ are formed on the original substrate 301. The alignment marks $302a_1$ to $302a_3$, and $302b_1$ to $302b_3$ are disposed corresponding to the objects to be transferred $301a$, to $301a_3$. In this example, the positions of the objects to be transferred with respect to the respective alignment marks are determined corresponding to the positions to be transferred.

As shown in FIG. 22(b), the alignment marks 202a and 202b are formed on the destination substrate 201.

Subsequently, an example of usage of these alignment marks will be described. Adjustment of the alignment of the alignment marks 103a and 103b on the mask 102 and the alignment marks 202a and 202b on the destination substrate 201 are performed by moving the A stage 200. Subsequently, an adhesive agent is applied on the object to be transferred $301a_1$ of the original substrate 301, and the B stage 300 is moved to align the alignment marks $302a_1$ and $302b_1$ on the original substrate 301 with the alignment marks 202a and 202b on the destination substrate 201. The A stage 200 is moved upward and adhered thereto, and then the laser beam 101a is irradiated to make the object to be transferred $301a_1$ possible to be transferred from the original substrate 301. In this case, it is convenient to use the mask as shown in FIG. 21, with which a plurality of regions can be selectively irradiated. The A stage 200 is moved downward and the object to be transferred $301a_1$ is transferred to a predetermined position on the destination substrate 201. Then, an adhesive agent is applied on the object to be transferred $301a_2$ of the original substrate 301. The alignment marks 202a and 202b on the destination substrate 201 are moved to the B stage 300, and the alignment mark $302a_2$ and $302b_2$ of the original substrate 301 are aligned. The A stage 200 is moved upward and the destination substrate 201 and the original substrate 301 are adhered, and the laser beam 101a is irradiated thereon to make the object to be transferred $301a_2$ possible to be transferred. Subsequently, the A stage 200 is moved downward and the object to be transferred $301a_2$ is transferred to a predetermined position on the destination substrate 201. Then, an adhesive agent is applied to the object to be transferred $301a_3$ of the original substrate 301. The B stage 300 is moved to the alignment marks 202a and 202b on the destination substrate 201 to align the alignment marks $302a_3$ and $302b_3$ of the original substrate 301. The A stage 200 is moved upward to adhere the destination substrate 201 and the original substrate 301, then the laser beam 101a is irradiated to make the object to be transferred $301a_3$. The A stage 200 is moved downward and the object to be transferred $301a_3$ is transferred to a predetermined position on the destination substrate 201.

It is also applicable to provide a plurality of masks 102 as shown in FIG. 19, but having holes at different positions, so that the mask 102 is replaced one after another corresponding to the change of the position to be transferred to align the alignment mark on the destination substrate 201 with the alignment mark on the mask 102. It is also applicable to adjust the position to irradiate the laser beam 101a corresponding to the change of the position of the mask holes by moving the laser source 101, for example.

In this manner, assembling of a plurality of active electronic elements or circuits in one region on the destination substrate 201 is achieved.

Figure 23:
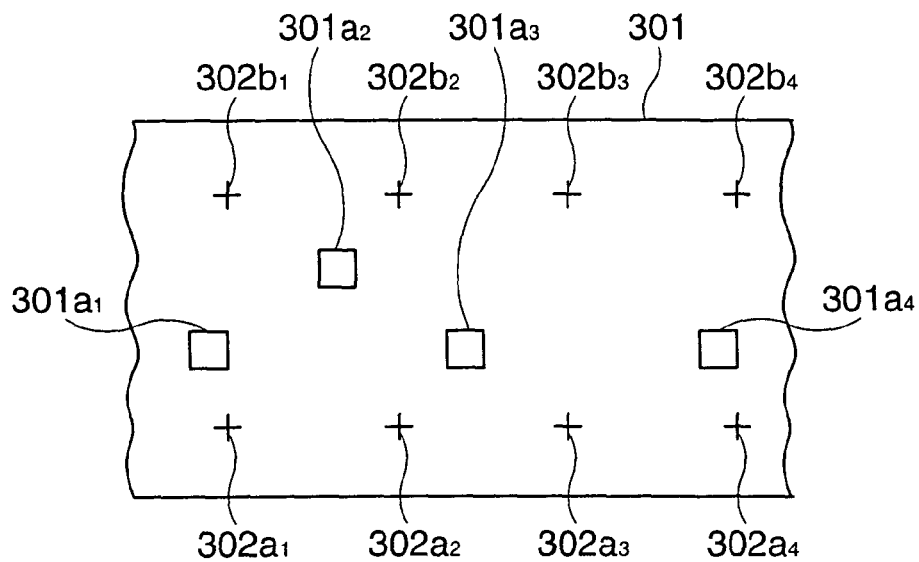
FIGS. 23(a) and 23(b) are schematics illustrating an example of arrangement of the alignment marks in the case where a plurality of objects to be transferred are transferred to a plurality of regions on the destination substrate.
Figure 23:
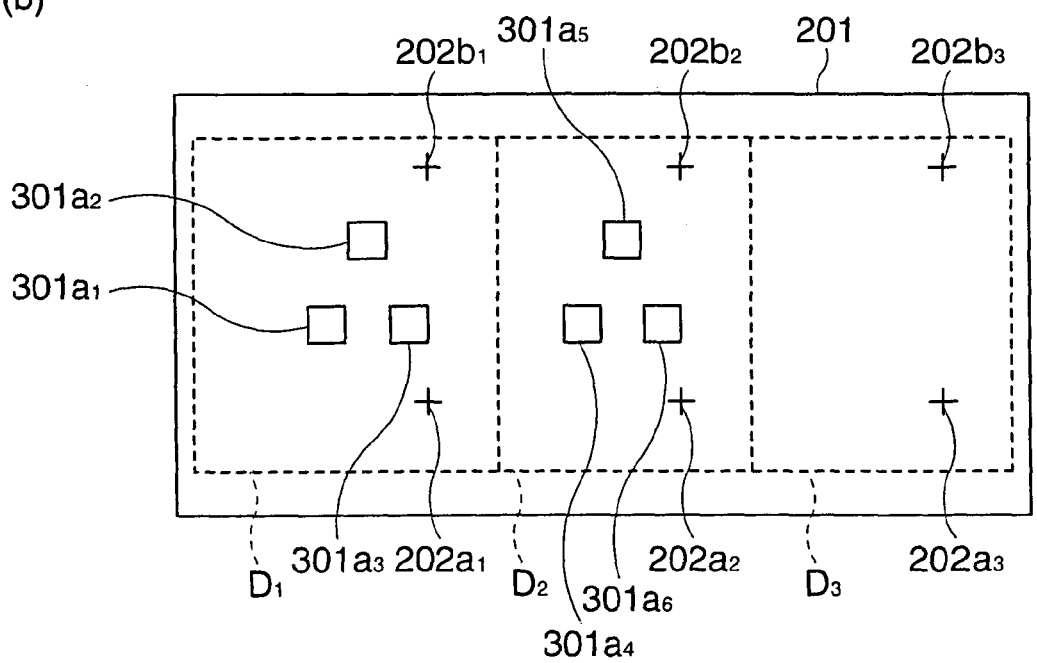

FIGS. 23(a) and 23(b) show another example of arrangement of the alignment mark. In this example, a plurality of thin film elements or thin film circuits are adhered in a plurality of regions on the destination substrate 201, for example, in a plurality of regions corresponding to the number of a plurality of IC cards or the displays.

As shown in FIG. 23(a), the original substrate 301 is formed with the objects to be transferred $301a_1$, $301a_2$, $301a_3$, . . . . The alignment marks $302a_1$, $302a_2$, . . . and $302b_1$, $302b_2$, . . . are arranged corresponding to the objects to be transferred $301a_1$, $301a_2$, $301a_3$, . . . . In this example, the positions of the objects to be transferred with respect to the respective alignment marks are determined corresponding to the positions to be transferred. The object to be transferred $301a_n$ is divided into groups by the corresponding regions $D_n$ on the destination substrate 201, and the same type or the different types of thin film elements or thin film circuits are formed thereon.

As shown in FIG. 23(b), the destination substrate 201 is formed with a plurality of regions $D_1$, $D_2$, $D_3$, . . . on which the IC card or the display must be assembled. The regions $D_1$, $D_2$, $D_3$, . . . are formed with the alignment marks $202a_1$, $202a_2$, $202a_3$, . . . , respectively. These alignment marks formed on the respective regions are used to move the destination substrate 201 (or the A stage 200) step by step.

An example of usage of these alignment marks is described below. In order to perform the first transfer, the A stage 200 is moved to adjust alignment between the alignment marks 103a and 103b on the mask 102 and the alignment marks $202a_1$ and $202b_1$ on the destination substrate 201. Subsequently, an adhesive agent is applied to the object to be transferred $301a_1$ of the original substrate 301, then the B stage 300 is moved to align the alignment marks $302a_1$ and $302b_1$ on the original substrate 301 and the alignment marks $202a_1$ and $202b_1$ on the destination substrate 201. The A stage 200 is moved upward and adhere thereto, and the laser beam 101a is irradiated to make the object to be transferred $301a_1$ possible to be peeled from the original substrate 301. In this case, it is convenient to use the mask as shown in FIG. 21, with which a plurality of regions can be selectively irradiated. The A stage 200 is moved downward and the object to be transferred $301a_1$ is transferred to a predetermined position on the destination substrate 201.

In order to perform the second transfer, an adhesive agent is applied to the object to be transferred $301a_2$ on the original substrate 301. The B stage 300 is moved to align the alignment marks $202a_2$ and $202b_2$ on the destination substrate 201 with the alignment marks $301a_2$ and $302b_2$ on the original substrate 301. The A stage 200 is moved upward and adhere the destination substrate 201 and the original substrate 301, and then the laser beam 101a is irradiated to make the object to be transferred $301a_1$ possible to be peeled. Then the A stage 200 is moved downward and the object to be transferred $301a_2$ is peeled and transferred to a predetermined position on the destination substrate 201.

In order to perform the third transfer, an adhesive agent is applied to the object to be transferred $301a_3$ on the original substrate 301. The B stage 300 is moved to align the alignment marks $202a_1$ and $202b_1$ on the destination substrate 201 with the alignment marks $302a_3$ and $302b_3$ on the original substrate 301. The A stage 200 is moved upward to adhere the destination substrate 201 and the original substrate 301, and the laser beam 101a is irradiated to make the object to be transferred 301$a_3$ possible to be peeled. Then, the A stage 200 is moved downward and the object to be transferred 301$a_3$ is peeled and transferred to a predetermined position on the destination substrate 201.

Subsequently, a step-by-step movement is performed to change the region to be transferred on the destination substrate 201 from $D_1$ to $D_2$. In order to do so, the A stage 200 is moved to align the alignment marks 202$a_2$ and 202$b_2$ on the destination substrate 201 with the alignment mark 103$a$ and 103$b$ on the mask 102. The original substrate 301 is moved to the region to be transferred $D_2$ as in the cases of the first to the third transfer described above, and the objects to be transferred 301$a_4$, 301$a_5$, and 301$a_6$ are peeled and transferred.

The assembling operation using such a transfer technology is performed for each region $D_1$, $D_2$, $D_3$, . . . , and the destination substrate on which assembly is completed is transferred from the A stage 200 to the next process. When the objects to be transferred 301$a_1$, 301$a_2$, 301$a$, . . . are completely transferred, the substrate 301 is replaced.

In this exemplary embodiment of step-by-step transfer, it is also possible to provide a plurality of masks 102 as shown in FIG. 19, but having holes at different positions, and replace the mask 102 one after another corresponding to the change of the position to be transferred to align the alignment mark on the destination substrate 201 to the alignment mark on the mask 102. It is also possible to adjust the position to irradiate the laser beam 101$a$ corresponding to the change of the position of the mask hole by moving the laser beam source 101, for example.

Figure 24:
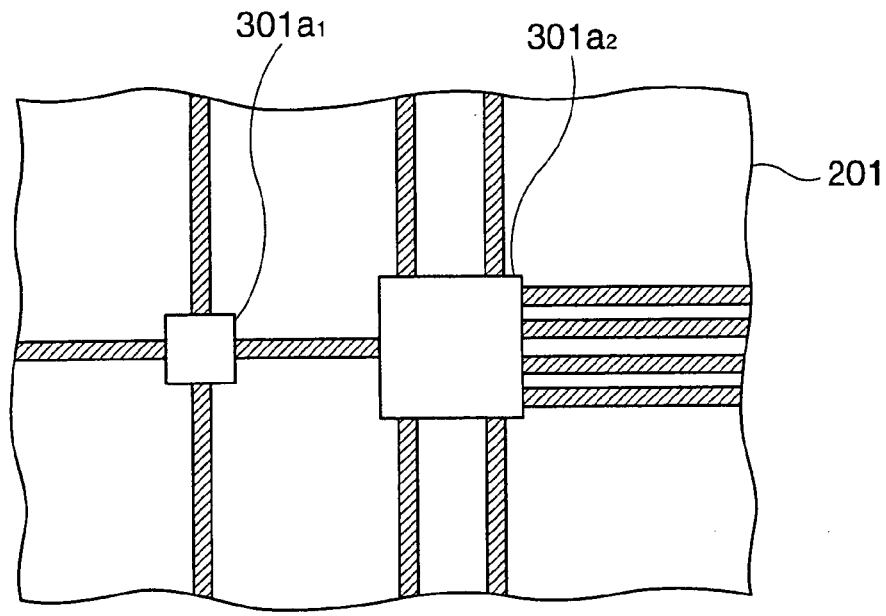
FIG. 24 is a schematic illustrating an example of transfer of the thin film element or the thin film circuit to the destination substrate.

FIG. 24 shows a state in which the thin film element (301$a_1$) or the thin film circuit (301$a_2$) is transferred to the destination substrate 201. The destination substrate 201 is formed with a wiring, and the thin film element or the thin film circuit are connected to the wiring. Connection may be achieved by wire bonding or via a connecting substrate, which is not shown. For example, in the case of the IC card, the destination substrate 201 is a thin film substrate in a form of a film, and two plastic plates having a printed connecting circuit are adhered on both sides thereof via anisotropic conductive films.

Figure 25:
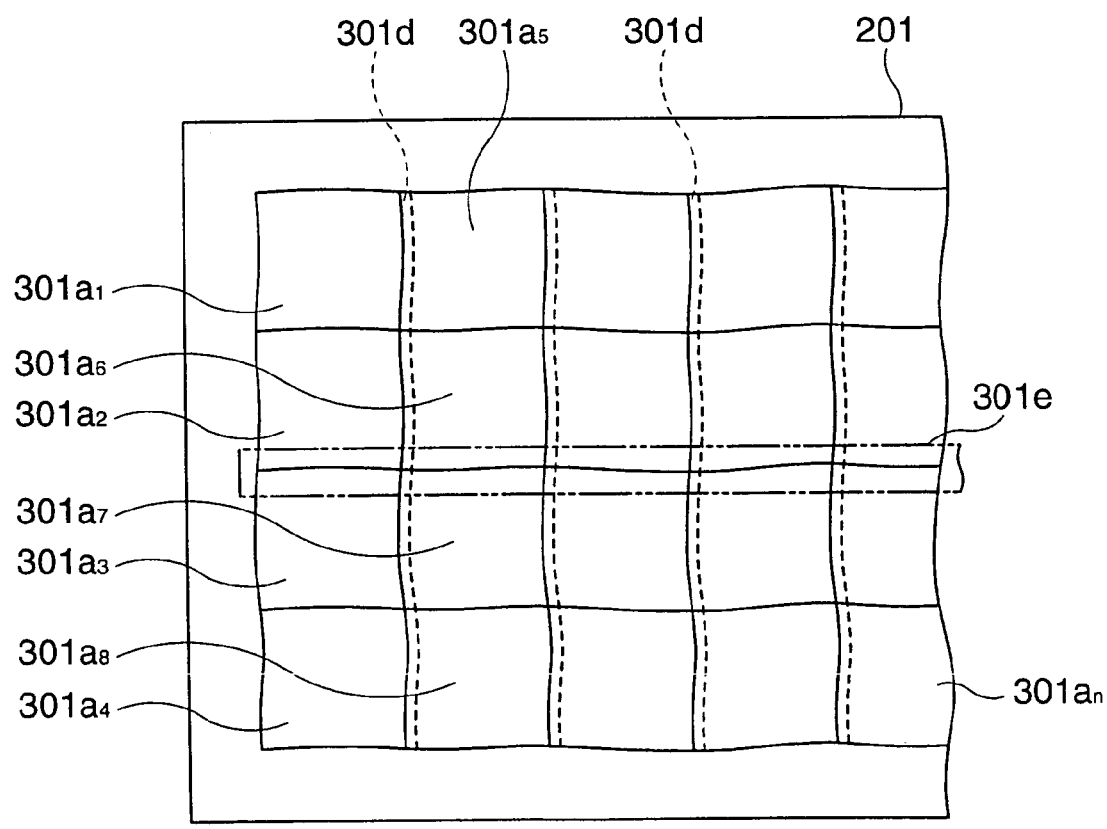
FIG. 25 is a schematic illustrating another example of transfer of the thin film circuit to the destination substrate.

FIG. 25 shows an example in which a large sized electronic device is manufactured by arranging the thin film circuits 301$a_1$, to 301$a_n$ in a matrix by adhering them on a large destination substrate 201, for example, a glass substrate, in the same manner as tiling. The large electronic device corresponds to a electric optical device, such as a liquid crystal display or an organic EL device. The electronic device may be a memory or a gate array. The thin film circuit for the electric optical device corresponds to a unit of display element array. Connection between the thin film circuits may be achieved by superimposing regions 301$d$ on each of the thin film circuits, which are parts of those thin film circuits. The connection is also achieved by connecting the adjacent thin film circuits by a bridge wiring via a wiring film 301$e$ formed further on the thin film circuit group.

In this manner, a plurality of thin film elements or thin film circuits can be assembled in a plurality of regions on the destination substrate 201.

(Application)

Another mode of action in the manufacturing apparatus described above is described below.

In the exemplary embodiment described above, adjustment of alignment between the substrates is performed by aligning the reference position on the destination substrate 201 with the reference position on the mask 102, and aligning the reference position on the original substrate 301 with the reference position on the destination substrate 201. However, it is also possible to align the reference position on the destination substrate 201 with the reference position on the mask 102, and align the reference position on the original substrate 301 with the reference position on the mask 102. In this case, alignment with a higher degree of accuracy is achieved.

In the step-by-step operation in the exemplary embodiment described above, adjustment of alignment between the mask 102 and the destination substrate 201 are performed every time when the region to be transferred $D_n$ on the destination substrate 201 is changed to align the destination substrate 201 with a high degree of accuracy. However, it is also possible to perform the adjustment of alignment only with the first transfer process, and then perform the step-by-step operation depending on the mechanical accuracy of the A stage from the next process on, so that time required for adjustment of alignment is reduced.

In the exemplary embodiment described above, the alignment marks are observed from both sides by the CCD cameras 601$a$ and 601$b$ disposed above for observing the substrate from the reference surface side (the side of the mask 102) and the CCD cameras 602$a$ and 602$b$ disposed below to observe the reference surface from the substrate side. However, it is also possible to observe only from one side by a camera disposed on either side.

In the exemplary embodiment described above, different alignment marks are used for every object to be transferred 301$a_n$ or for every region to be transferred $D_n$. However, it is also possible to use the same alignment mark and obtain the corresponding positions depending on the accuracy of movement of the stage.

In the exemplary embodiment described above, the alignment mark is formed on the substrate. However, when using the pattern on the substrate (for example, a circuit pattern), it is also possible to avoid formation of alignment marks separately from the pattern of the thin film circuit or the like based on the function of the substrate.

In the exemplary embodiment described above, the patterns on the mask, the destination substrate, and the original substrate are arranged in reference to the alignment marks. A plurality of times of transfer in a single region and a plurality of times of transfer for a plurality of regions are possible by using the alignment mark for every transfer (every object to be transferred) or for every region.

In the exemplary embodiment described above, the original substrate 301 is transported to the position of the adhesive agent applying unit 500 by the substrate transporting unit 400 to apply an adhesive agent to the region to be transferred on the substrate and then transported to the B stage 300. However, it is also possible to transport the destination substrate 201 to the position of the adhesive agent applying unit 500 by the substrate transporting unit 400 to apply an adhesive agent to the region to be transferred on the destination substrate 201 and then transported to the A stage 200. Alternatively, it is also possible to move the adhesive agent applying unit 500 to apply an adhesive agent on the corresponding position on the destination substrate 201 or the original substrate 301. In addition, it is also applicable to fix the nozzle position of the adhesive agent applying unit 500, which discharges an adhesive agent, and move the A or B stage, on which the substrate is placed, to apply an adhesive agent to a predetermined position.

Furthermore, in the exemplary embodiment described above, a piezoelectric element disposed in a matrix on the A stage 200 is used as a sensor or a driving unit by switching the driver. However, it is also possible to provide a sensor and a driving unit by the use of a piezoelectric element or the like separately, so that adjustment is performed by driving the driving unit while detecting by the sensor. They are not limited to the piezoelectric element.

As described above, the suitable optical mask 102 can be selected every time from a plurality of types of mask having openings corresponding to the positions to be transferred.

The laser beam can be split by the diffraction mask to form an array of spots. It is also possible to selectively irradiate a laser beam entirely or partly to a plurality of regions by guiding the laser beam to a desired position by the optical fiber cable and the optical switch.

As described above, according to the method and apparatus for manufacturing electronic devices of the present invention, transfer of the thin film element or the thin film circuit between the substrates can be automated. The exemplary embodiments or applications can be used by combining as needed according to the usage, and the present invention is not limited to the exemplary embodiments.

As described above, according to a method and an apparatus for manufacturing electronic devices of the invention, since an electronic device can be assembled by transferring a thin film element or a thin film circuit formed on one substrate to another substrate, a plurality of thin film elements or thin film circuits formed on other substrates can be arranged on a large substrate, and thus a large electronic device, such as a large liquid crystal display panel or an organic EL display, can be manufactured by using a relatively small manufacturing apparatus. In addition, the electronic device can be assembled by combining a thin film element or a thin film circuit manufactured separately in the processes under difference conditions, such as an allowable process temperature or the drawing width.

What is claimed is:

1. A method of manufacturing an electronic device, the method comprising:
   selecting one of a mask substrate, a first substrate on which a physical object to be transferred is formed, and a second substrate to which the physical object is to be transferred, as a reference substrate for alignment;
   adjusting positions of the mask substrate, the first substrate and the second substrate so that an alignment mark formed on the reference substrate and alignment marks formed on other two of the mask substrate, the first substrate and the second substrate are aligned with each other; and
   transferring the physical object from the first substrate to the second substrate, the transferring of the physical object including irradiating the physical object to be transferred with light transmitted through the mask substrate.

2. The method according to claim 1, the mask substrate having a plurality of windows that transmit light to the physical object to be transferred.

3. The method according to claim 2, the irradiating of the physical object to be transferred including branching a beam of light with a branching unit including at least one of a diffraction grating and a plurality of optical fibers.

4. The method according to claim 1, further comprising:
   adhering the first substrate and the second substrate, the adhering of the first substrate and the second substrate being carried out before the transferring of the physical object from the first substrate to the second substrate.

5. The method according to claim 4, the transferring of the physical object from the first substrate to the second substrate further including separating the first substrate and the second substrate.

6. The method according to claim 1, further comprising:
   transporting the second substrate to a bed using a substrate transporting unit; and
   fixing the second substrate on the bed.

7. A method of manufacturing an electronic device, the method comprising:
   providing a first substrate on which a physical object to be transferred and a first alignment mark are formed, a second substrate on which a second alignment mark is formed, and a mask substrate on which a third alignment mark is formed;
   aligning the second alignment mark formed on the second substrate and the third alignment mark formed on the mask substrate;
   aligning the first alignment mark formed on the first substrate with the second alignment mark formed on the second substrate; and
   transferring the physical object from the first substrate to the second substrate, the transferring of the physical object including irradiating the physical object to be transferred with light transmitted through the mask substrate.

8. The method according to claim 7, further comprising:
   adhering the first substrate and the second substrate, the adhering of the first substrate and the second substrate being carried out before the transferring of the physical object from the first substrate to the second substrate.

9. The method according to claim 8, the transferring of the physical object from the first substrate to the second substrate further including separating the first substrate and the second substrate.

10. The method according to claim 7, further comprising:
    transporting the second substrate to a bed using a substrate transporting unit; and
    fixing the second substrate on the bed.

11. A method of manufacturing an electronic device, the method comprising:
    providing a first substrate on which a physical object to be transferred and a first alignment mark are formed, a second substrate on which a second alignment mark is formed, and a mask substrate on which a third alignment mark is formed;
    aligning the first alignment mark formed on the first substrate with the third alignment mark formed on the mask substrate;
    aligning the second alignment mark formed on the second substrate with the first alignment mark formed on the first substrate; and
    transferring the physical object from the first substrate to the second substrate, the transferring of the physical object including irradiating the physical object to be transferred with light transmitted through the mask substrate.

12. The method according to claim 11, further comprising:
    adhering the first substrate and the second substrate, the adhering of the first substrate and the second substrate being carried out before the transferring of the physical object from the first substrate to the second substrate.

13. The method according to claim 12, the transferring of the physical object from the first substrate to the second substrate further including separating the first substrate and the second substrate.

14. The method according to claim 11, further comprising:
- transporting the second substrate to a bed using a substrate transporting unit; and
- fixing the second substrate on the bed.

15. A method of manufacturing an electronic device, the method comprising:
- providing a first substrate on which a physical object to be transferred and a first alignment mark are formed, a second substrate on which a second alignment mark is formed, and a mask substrate on which a third alignment mark is formed;
- aligning the first alignment mark formed on the first substrate with the third alignment mark formed on the mask substrate;
- aligning the second alignment mark formed on the second substrate with the third alignment mark formed on the mask substrate; and
- transferring the physical object from the first substrate to the second substrate, the transferring of the physical object including irradiating the physical object to be transferred with light transmitted through the mask substrate.

16. The method according to claim 15, further comprising:
- adhering the first substrate and the second substrate, the adhering of the first substrate and the second substrate being carried out before the transferring of the physical object from the first substrate to the second substrate.

17. The method according to claim 16, the transferring of the physical object from the first substrate to the second substrate further including separating the first substrate and the second substrate.

18. The method according to claim 15, further comprising:
- transporting the second substrate to a bed using a substrate transporting unit; and
- fixing the second substrate on the bed.

* * * * *